(12) United States Patent
King et al.

(10) Patent No.: US 9,985,160 B2
(45) Date of Patent: May 29, 2018

(54) GROUP-IV SOLAR CELL STRUCTURE USING GROUP-IV OR III-V HETEROSTRUCTURES

(75) Inventors: Richard R. King, Thousand Oaks, CA (US); Christopher M. Fetzer, Valencia, CA (US); Nasser H. Karam, La Canada, CA (US)

(73) Assignee: THE BOEING COMPANY, Chicago, IL (US)

( * ) Notice: Subject to any disclaimer, the term of this patent is extended or adjusted under 35 U.S.C. 154(b) by 1179 days.

(21) Appl. No.: 13/619,625

(22) Filed: Sep. 14, 2012

(65) Prior Publication Data

US 2014/0076391 A1 Mar. 20, 2014

(51) Int. Cl.
| | |
|---|---|
| *H01L 31/0725* | (2012.01) |
| *H01L 31/074* | (2012.01) |
| *H01L 31/078* | (2012.01) |
| *H01L 31/0745* | (2012.01) |
| *H01L 31/0687* | (2012.01) |

(52) U.S. Cl.
CPC ...... *H01L 31/0725* (2013.01); *H01L 31/0687* (2013.01); *H01L 31/074* (2013.01); *H01L 31/078* (2013.01); *H01L 31/0745* (2013.01); *Y02E 10/544* (2013.01)

(58) Field of Classification Search
CPC ... Y02E 10/544; Y02E 10/50; H01L 31/0725; H01L 31/1852; H01L 31/078; H01L 31/0687; H01L 31/18; H01L 21/02381; H01L 31/1844
USPC .................................................. 136/243–265
See application file for complete search history.

(56) References Cited

U.S. PATENT DOCUMENTS

| | | |
|---|---|---|
| 6,316,715 B1 | 11/2001 | King et al. |
| 6,340,788 B1 | 1/2002 | King et al. |
| 2002/0179142 A1 | 12/2002 | Wada et al. |
| 2004/0065363 A1 | 4/2004 | Fetzer et al. |
| 2004/0200523 A1* | 10/2004 | King et al. ............. 136/262 |
| 2009/0173373 A1 | 7/2009 | Walukiewicz et al. |

(Continued)

FOREIGN PATENT DOCUMENTS

| | | |
|---|---|---|
| EP | 1 109 230 A2 | 6/2001 |
| KR | 20110128155 A | 11/2011 |

(Continued)

OTHER PUBLICATIONS

Kouvetakis et al., "Independently Tunable Electronic and Structural Parameters in Ternary Group IV Semiconductors for Optoelectronic Applications," The 5th International Symposium on Advanced Science and Technology of Silicon Materials (JSPS Si Symposium), Nov. 10-14, 2008, Kona, HI, 4 pages.

(Continued)

*Primary Examiner* — Mayla Gonzalez Ramos
(74) *Attorney, Agent, or Firm* — MH2 Technology Law Group LLP

(57) ABSTRACT

Device structures, apparatuses, and methods are disclosed for photovoltaic cells that may be a single junction or multijunction solar cells, with at least a first layer comprising a group-IV semiconductor in which part of the cell comprises a second layer comprising a III-V semiconductor or group-IV semiconductor having a different composition than the group-IV semiconductor of the first layer, such that a heterostructure is formed between the first and second layers.

19 Claims, 18 Drawing Sheets

(56) References Cited

U.S. PATENT DOCUMENTS

| | | |
|---|---|---|
| 2010/0243038 A1 | 9/2010 | Kukulka |
| 2010/0282305 A1 | 11/2010 | Sharps et al. |
| 2011/0005570 A1 | 1/2011 | Jain |
| 2011/0120538 A1 | 5/2011 | Lochtefeld et al. |
| 2011/0254052 A1 | 10/2011 | Kouvetakis et al. |
| 2011/0316043 A1 | 12/2011 | Kouvetakis et al. |

FOREIGN PATENT DOCUMENTS

| | | |
|---|---|---|
| WO | WO 2013/033671 A1 | 3/2013 |
| WO | WO 2013030531 A1 * | 3/2013 |

OTHER PUBLICATIONS

Shahrjerdi et al., "Low-Temperature a—Si:H/GaAs Heterojunction Solar Cells," IEEE Journal of Photovoltaics, vol. 1, No. 1, Jul. 2011, pp. 104-107.

Sun et al., "Efficient Si-on-Ge Tandem Solar Cell," 2009 6th IEEE International Conference on Group IV Photonics, pp. 187-189.

Conley et al., "High Efficiency MH Solar Cells and TPV Using SiGeSn Materials," 2011, IEEE, pp. 1189-1192.

Cornfield et al., "Evolution of a 2.05 eV AlGaInP Top Sub-Cell for 5 and 6J-IMM Applications," 2011, IEEE, pp. 2788-2791.

Extended European Search Report dated Sep. 9, 2017 for EP Application No. 13184428.4.

Extended European Search Report dated Sep. 15, 2017 for EP Application No. 1318442.9.

Extended European Search Report dated Sep. 13, 2017 for EP Application No. 13184422.7.

Extended European Search Report dated Sep. 19, 2017 for EP Application No. 13184436.7.

Extended European Search Report dated Sep. 12, 2017 for EP Application No. 13184418.5.

Extended European Search Report dated Sep. 21, 2017 for EP Application No. 13184437.5.

* cited by examiner

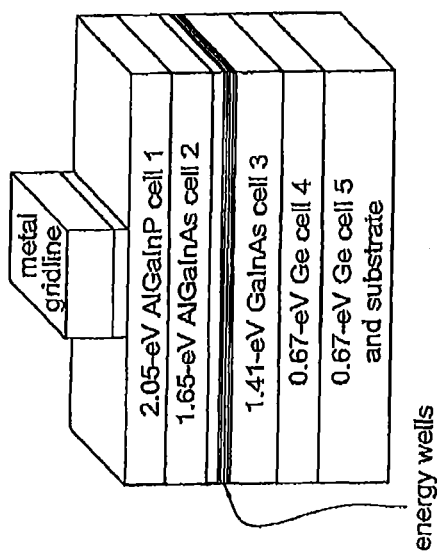
FIG. 15
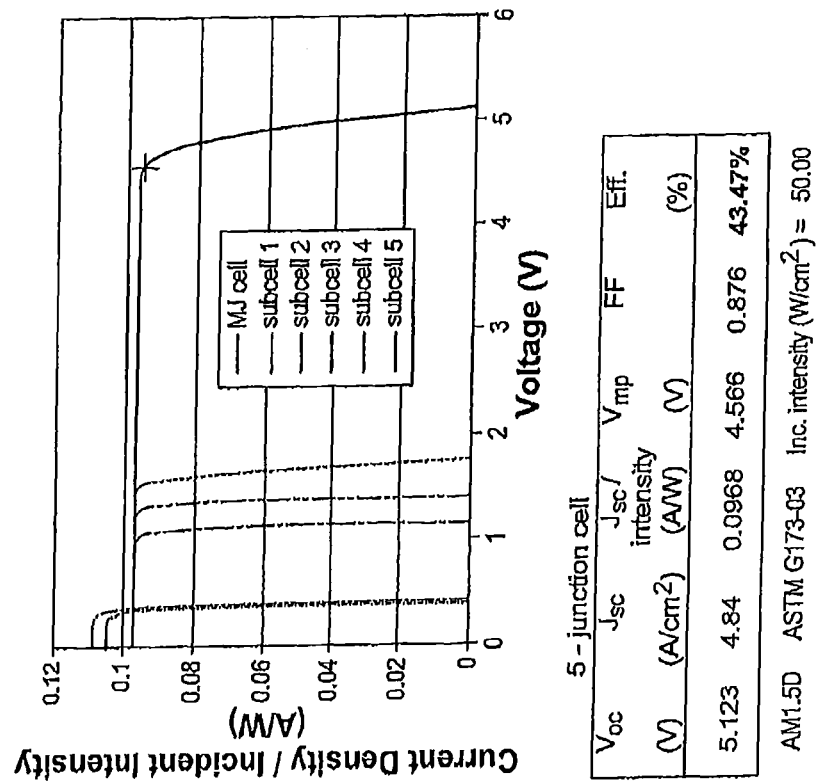

GROUP-IV SOLAR CELL STRUCTURE USING GROUP-IV OR III-V HETEROSTRUCTURES

TECHNOLOGICAL FIELD

The present disclosure relates to photovoltaic cells and their methods of manufacture and, more particularly, to improved single junction cells or subcells in a multijunction photovoltaic (PV) cell, especially a solar cell, having multiple layers to form a hetero structure.

BACKGROUND

Advances in photovoltaic cells remain important for terrestrial and non-terrestrial applications. In the non-terrestrial environment of outer space, as well as terrestrial applications, photovoltaic cells offer a valuable means for providing power generation by converting the abundant resource of the sun's energy to electrical power.

Irrespective of the application, and as with any energy generation system, efforts continue to increase the output and/or efficiency of PV cells. With respect to output, multiple cells or layers having differing energy bandgaps have been stacked so that each cell or layer can absorb a different part of the wide energy distribution of photons found in sunlight. Stacked arrangements have been provided in monolithic structures on a single substrate, or on multiple substrates.

In the multiple cell device, known as multijunction solar cells, multijunction photovoltaic cells, or multijunction cells, semiconductor materials are typically lattice-matched to form the solar cells within the multiple cell device, known as subcells within the multijunction solar cell. Each subcell typically contains at least one collecting p-n (or n-p) junction. A multijunction solar cell with 2 subcells is typically called a 2-junction cell; one with 3 subcells is called a 3-junction cell, etc. so that cells with n subcells are called n-junction cells, where n is an integer.

Additionally, the subcells within a multijunction cell are often interconnected in series by tunnel junctions between subcells, that act as low resistance contacts that typically are not photoactive. In contrast, the collecting junctions in each subcell typically are photoactive. The term photoactive means that a given photoactive layer, structure, subcell, etc. within a solar cell contributes to the output current and/or voltage of the overall solar cell, in response to light incident on the solar cell. As described earlier in the text, the numbering of 2-junction (2J), 3-junction (3J), and, in general, n-junction (nJ) solar cells is determined by the number of subcells, or collecting junctions, not including tunnel junctions.

The collecting junction of a photovoltaic solar cell or subcell typically consists of a p-n junction between a layer of one doping type (either p-type or n-type), typically called an emitter layer, and another layer of the opposite doping type, typically called a base layer. The junction may also consist of a p-i-n junction in which an intrinsic semiconductor layer with little or no extrinsic dopant concentration is placed between the emitter layer of one doping type and the base layer of the opposite doping type. Typically, the emitter layer is considered to be the layer that is closer to the primary light source for the solar cell than the base, and the base layer is considered to be the layer that is farther from the primary light source than the emitter. Typically, the front surface of a solar cell or solar cell component is considered to be the surface closer to the primary light source for the solar cell, and the back surface of a solar cell or solar cell component is considered to be the surface farther from the light source. However, there can be exceptions to this typical terminology, for instance when both back surface and front surface illumination are incident on the solar cell.

Both the collecting junctions and the tunnel junctions can be of the homojunction or heterojuction type. When solar energy is absorbed by a subcell, minority carriers (i.e. electrons and holes) are generated in the conduction and valence bands of the semiconductor materials adjacent the collecting junction. A voltage is thereby created across the junction and a large portion of the photogenerated current can be collected at a finite voltage to generate electrical power. As the photons in the solar spectrum pass to the next junction that typically has been optimized for a lower energy range, additional photons in this lower energy range can be converted into a useful current. With a greater number of junctions, greater conversion efficiency and increased output voltage and electrical power can be obtained.

With multijunction cells, efficiency is limited by the requirement of low resistance interfaces between the individual cells to enable the generated current to flow from one cell to the next. In a monolithic structure, tunnel junctions have been used as described earlier in the text to minimize the blockage of current flow. In a multiple wafer structure, front and back metalization grids with low coverage fraction and transparent conductors have been used for low resistance connectivity.

Another limitation to the multiple cell PV device, or multijunction cell, is that current output in each subcell must be the same for optimum efficiency in the series-connected configuration. In addition, there has been a practical limit on the number of subcells (also referred to as collecting junctions or subcell junctions) employed, since the benefit of each successive subcell becomes smaller as the number of subcells increases, and each subcell has certain parasitic losses associated with it in practice, tending to counteract the greater efficiency that comes from dividing the incident spectrum into smaller energy ranges with a greater number of subcells.

The concern over efficiency in PV cells has created interest in optimizing 1-junction solar cells such as silicon (Si) cells and gallium arsenide (GaAs) cells, and in developing higher-efficiency multijunction cells such as conventional 3-junction GaInP/GaInAs/Ge solar cells, which employ a gallium indium phosphide (GaInP) top subcell, also called cell 1 or C1, a gallium indium arsenide (GaInAs) subcell in the cell 2 (C2) position, and a germanium (Ge) subcell formed by a Ge wafer growth substrate in the cell 3 (C3) position. In this 3-junction solar cell, cell 3 is also the bottom subcell. Thus the subcells are numbered in the order in which the incident light passes through the multijunction cell. The material name associated with a solar cell or subcell is typically the material that is the dominant photoabsorber in the cell, which is typically the base of the solar cell.

The structures described above have relatively high current densities, which can present problems for current matching subcells that are poor current producers. The comparatively high current densities and low voltages of these cells with 1 to 3 subcells result in greater relative power loss due to series resistance. Further, subcell base thicknesses can be comparatively large, and some subcells have little excess photogenerated current density, both of which impair radiation resistance. Limited excess photogenerated current density in low bandgap subcells can also impair the fill factor of the overall multijunction solar cell that they are in.

BRIEF SUMMARY

The present invention is directed to a photovoltaic cell comprising two or more group-IV solar cells which are subcells within a multijunction cell, where at least one group-IV subcell is an upper subcell positioned closer to the primary light source than at least one other group-IV subcell which is a lower subcell, and where the at least one upper group-IV subcell has a higher direct and/or indirect energy bandgap than the at least one lower group-IV subcell. (See FIG. 12).

According to the disclosure, the photovoltaic cell may further comprise an upper subcell comprising at least one group-IV layer in which the majority of photogeneration for that upper subcell takes place, with a direct and/or indirect bandgap higher than the group-IV layer in a lower subcell in which the majority of photogeneration for that lower subcell takes place, where the compositions for the group-IV layers in the upper and lower subcells may be selected from a group including: Ge, Si, SiGe, CGe, GeSn, SiGeSn, and CSiGeSn.

According to the disclosure, the photovoltaic cell may further comprise an upper subcell comprising a Si, CGe, SiGe, SiGeSn or CSiGeSn layer in which the majority of photogeneration for that upper subcell takes place, and a Ge, SiGe, CSn, SiSn, GeSn, SiGeSn, or CSiGeSn layer in the lower subcell for which the majority of photogeneration for that lower subcell takes place.

According to the disclosure, the photovoltaic cell may further comprise an upper group-IV subcell 1 comprising at least one group-IV layer in which the majority of photogeneration for that subcell 1 takes place, with a direct and/or indirect bandgap higher than the group-IV layer in a group-IV subcell 2 in which the majority of photogeneration for that group-IV subcell 2 takes place, where in turn the group-IV subcell 2 has a direct and/or indirect bandgap higher than the group-IV layer in a group-IV subcell 3 in which the majority of photogeneration for that group-IV subcell 3 takes place, continuing in this way for n group-IV subcells where n is an integer greater than or equal to 2, and where the compositions for the group-IV layers in the group-IV subcells 1, 2, 3, . . . , n may be selected from a group including: Ge, Si, SiGe, CGe, GeSn, SiGeSn, and CSiGeSn.

According to the disclosure, any or all of the two or more group-IV solar cells may comprise a solar cell emitter in which the majority of the total photogeneration in the photovoltaic cell or subcell takes place, such that the photogenerated current density in the emitter is greater than that in the base.

According to the disclosure, any or all of the two or more group-IV solar cells may further comprise: an n-type emitter layer comprising a group-IV element selected from the group including Ge, Si, SiGe, CGe, GeSn, SiGeSn, CSiGeSn and combinations thereof; and a p-type group-III-V semiconductor base, back-surface-field (BSF), or back heterostructure layer selected from the group including GaAs, AlGaAs, GaInAs, AlGaInAs, InP, GaP, GaInP, GaInPAs, AlInP, AlGaInP, InAs, InPAs, AlInAs, AlAs, GaSb, GaAsSb, InSb, GaInAsSb, GaInNAs, GaInNAsSb, GaN, AlN, InN, GaInN, AlGaN, AlInN, AlGaInN, and combinations thereof.

According to the disclosure, any or all of the two or more group-IV solar cells may further comprise: an n-type emitter layer comprising a group-IV element selected from the group consisting of: Ge, Si, SiGe, CGe, GeSn, SiGeSn, CSiGeSn, and combinations thereof; and a p-type group-IV semiconductor base, back-surface field (BSF), or back heterostructure layer selected from the group consisting of: Ge, Si, SiGe, CGe, GeSn, SiGeSn, CSiGeSn, and combinations thereof, where the group-IV emitter layer has a different semiconductor composition than the group-IV base or BSF layer, forming a heterojunction.

Preferably, the heterostructure or heterojunction in any or all of the two or more group-IV solar cells comprises materials on both sides of the heterostructure or heterojunction, and growth, deposition, formation, and/or annealing conditions at the interface that are selected to reduce minority-carrier recombination at layer interfaces and within the materials on both sides forming the heterostructure or heterojunction.

According to the disclosure, the photovoltaic cell structure may further comprise a tunnel junction electrically interconnecting the two or more group-IV solar cells grown on, deposited on, formed on, or formed within a growth substrate.

According to the disclosure, any or all of the two or more group-IV solar cells may further comprise: a first layer comprising a solar cell emitter layer formed from a group-IV layer, and a second layer comprising tunnel junctions formed from one or more III-V semiconductor layers, where the one or more tunnel junction semiconductor layers may be selected from a group including: GaAs, AlGaAs, GaInAs, AlGaInAs, InP, GaP, GaInP, GaInPAs, AlInP, AlGaInP, InAs, InPAs, AlInAs, AlAs, GaSb, GaAsSb, InSb, GaInAsSb, GaInNAs, GaInNAsSb, GaN, AlN, InN, GaInN, AlGaN, AlInN, AlGaInN, and combinations thereof.

According to the disclosure, any or all of the two or more group-IV solar cells may further comprise: a first layer comprising a solar cell emitter layer formed from one or more group-IV semiconductor layers, and a second layer comprising tunnel junctions formed from one or more group III-V semiconductor layers, where the tunnel junctions may be selected from a group including:
p+GaAs/n+GaAs tunnel junctions;
p+AlGaAs/n+GaAs tunnel junctions;
p+GaAs/n+AlGaAs tunnel junctions;
p+AlGaAs/n+AlGaAs tunnel junctions;
p+AlGaAs/n+GaInP tunnel junctions;
p+AlGaAs/n+AlGaInP tunnel junctions; and
p+AlGaInP/n+AlGaInP tunnel junctions,
and where the second layer comprising tunnel junctions may or may not be positioned adjacent to the first layer.

Furthermore, any or all of the two or more group-IV solar cells may comprise a solar cell emitter layer formed from one or more group-IV semiconductor layers that is an epitaxially-grown emitter layer comprising Ge, and that is grown on top of or positioned on top of a second layer comprising tunnel junctions formed from one or more group III-V semiconductor layers, where the tunnel junctions may be selected from a group including:
p+GaAs/n+GaAs tunnel junctions;
p+AlGaAs/n+GaAs tunnel junctions;
p+GaAs/n+AlGaAs tunnel junctions;
p+AlGaAs/n+AlGaAs tunnel junctions;
p+AlGaAs/n+GaInP tunnel junctions;
p+AlGaAs/n+AlGaInP tunnel junctions; and
p+AlGaInP/n+AlGaInP tunnel junctions,
and where the second layer comprising tunnel junctions may or may not be positioned adjacent to the first layer.

According to the disclosure, the doping of the solar cell emitter comprising one or more group-IV semiconductor materials in any or all of the two or more group-IV solar cells may be influenced by or may consist of the column-III and/or column-V elements in the solar cell base, BSF, and/or tunnel junction layers comprising one or more III-V semiconductor layers, where the column-III and/or column-V elements act as dopants in the group-IV emitter.

According to the disclosure, the doping of the solar cell base, BSF, or tunnel junction layers comprising one or more III-V semiconductor layers in any or all of the two or more group-IV solar cells may be influenced by or may consist of the column-IV element or elements in the group-IV solar cell emitter, where the column-IV element or elements act as dopants in the one or more III-V layers in the solar cell base, BSF, and/or tunnel junction layers.

According to the disclosure, any or all of the two or more group-IV solar cells may further comprise: a first layer comprising a solar cell emitter layer formed from one or more group-IV semiconductor materials, and a second layer comprising tunnel junctions formed from one or more group-IV semiconductor layers, where the one or more tunnel junction semiconductor layers may be selected from a group including: Ge, Si, SiGe, CGe, GeSn, SiGeSn, and CSiGeSn.

According to the disclosure, any or all of the two or more group-IV solar cells may further comprise: a first layer comprising a solar cell emitter layer formed from one or more group-IV semiconductor materials, and a second layer comprising tunnel junctions formed from one or more group-IV semiconductor layers, which may be selected from a group including:

strained or unstrained p+Ge/n+Ge tunnel junctions;
strained or unstrained p+SiGe/n+SiGe tunnel junctions;
strained or unstrained p+CGe/n+CGe tunnel junctions;
strained or unstrained p+SiGeSn/n+SiGeSn tunnel junctions;
strained or unstrained p+CSiGeSn/n+CSiGeSn tunnel junctions;
strained p+SiGe/n+Ge tunnel junctions;
p+Ge/strained n+SiGe tunnel junctions;
strained p+CGe/n+Ge tunnel junctions;
p+Ge/strained n+CGe tunnel junctions;
p+SiGeSn/n+Ge tunnel junctions;
p+Ge/n+SiGeSn tunnel junctions;
p+CSiGeSn/n+Ge tunnel junctions; and
p+Ge/n+CSiGeSn tunnel junctions.

According to the disclosure, the two or more group-IV solar cells may be subcells within a multijunction photovoltaic cell, and the multijunction photovoltaic cell may be selected from the group consisting of a 2-junction cell, 3-junction cell, 4-junction cell, 5-junction cell, 6-junction cell, and multijunction cells with 7 or more collecting junctions or subcells—i.e., from the group consisting of n-junction cells where n is an integer greater than or equal to 2—and the multijunction cell may further comprise a group-IV material to provide a selected bandgap combination among the subcells of the multijunction cell.

According to the disclosure, any or all of the two or more group-IV solar cells may be subcells within a multijunction photovoltaic cell that includes at least one group-IV semiconductor layer, that is epitaxially grown in a deposition apparatus, where the multijunction cell includes one or more additional subcells comprising III-V semiconductor layers.

According to the disclosure, any or all of the two or more group-IV solar cells may be subcells within a multijunction photovoltaic cell that includes at least one group-IV semiconductor layer, where the multijunction cell includes one or more additional subcells comprising group-IV semiconductor layers.

According to the disclosure, any or all of the two or more group-IV solar cells may have an emitter layer and a base layer, where the emitter layer is designed to be positioned closer to the primary light source for the solar cell during solar cell operation than the base layer.

According to the disclosure, any or all of the two or more group-IV solar cells may have an emitter layer and a base layer, where the base layer is designed to be positioned closer to the primary light source for the solar cell during solar cell operation than the emitter layer.

According to the disclosure, any or all of the two or more group-IV solar cells may have an emitter layer and a base layer, where the emitter layer is designed to be positioned at approximately the same distance from the primary light source for the solar cell during solar cell operation as the base layer.

According to the disclosure, any or all of the two or more group-IV solar cells may have an emitter layer and a base layer, where the emitter layer is deposited, grown, diffused, or otherwise formed after the base layer of the solar cell.

According to the disclosure, any or all of the two or more group-IV solar cells may have an emitter layer and a base layer, where the base layer is deposited, grown, diffused, or otherwise formed after the emitter layer of the solar cell.

According to the disclosure, any or all of the two or more group-IV solar cells may have an emitter layer and a base layer, where the emitter layer is deposited, grown, diffused, or otherwise formed at approximately the same time as the base layer of the solar cell.

According to the disclosure, any or all of the two or more group-IV solar cells may have an emitter layer and a base layer, where the emitter layer has a lower energy bandgap than the base layer of the solar cell.

According to the disclosure, any or all of the two or more group-IV solar cells may have an emitter layer and a base layer, where the emitter layer has a higher energy bandgap than the base layer of the solar cell.

According to the disclosure, any or all of the two or more group-IV solar cells may have an emitter layer and a base layer, where the emitter layer has approximately the same energy bandgap as the base layer of the solar cell.

Still further, the present disclosure is directed to a photovoltaic electricity generation system, energy storage system, and/or a vehicular energy system comprising a photovoltaic cell having a first layer comprising a group-IV material and a second layer comprising a material selected from the group consisting of: a III-V material and a group-IV material different from the first layer group-IV material, wherein a heterostructure is formed between the first layer and the second layer.

In some alternatives, the photovoltaic cells of the present disclosure have particular usefulness as a sustainable power source for use in stationary or mobile applications including terrestrial and non-terrestrial applications, and in manned and in unmanned vehicles, including aircraft, spacecraft and surface and sub-surface water-borne vehicles, etc.

Still further, the present disclosure is directed to a terrestrial, non-concentrating or concentrator photovoltaic electricity generation system, for utility-scale, commercial, residential, or personal electricity production.

Still further, the present disclosure is directed to an extraterrestrial, non-concentrating or concentrator photovoltaic electricity generation system, for satellite, manned space vehicle, or unmanned space vehicle electric power production in space or near space applications.

BRIEF DESCRIPTION OF THE DRAWING(S)

Having thus described variations of the disclosure in general terms, reference will now be made to the accompanying drawings, which are not necessarily drawn to scale, and wherein:

FIG. 1 is a cross-sectional diagram of a group-IV solar cell where the primary photoabsorber is an n-type Ge, SiGe, or SiGeSn emitter layer that may be doped by group-V elements from the III-V semiconductor layers beneath it and group-V elements from III-V semiconductor layers above it, and that forms the p-n junction of the solar cell at a heterostructure between the n-type Ge, SiGe or SiGeSn emitter and a p-type GaAs base or BSF layer;

Figure 4:
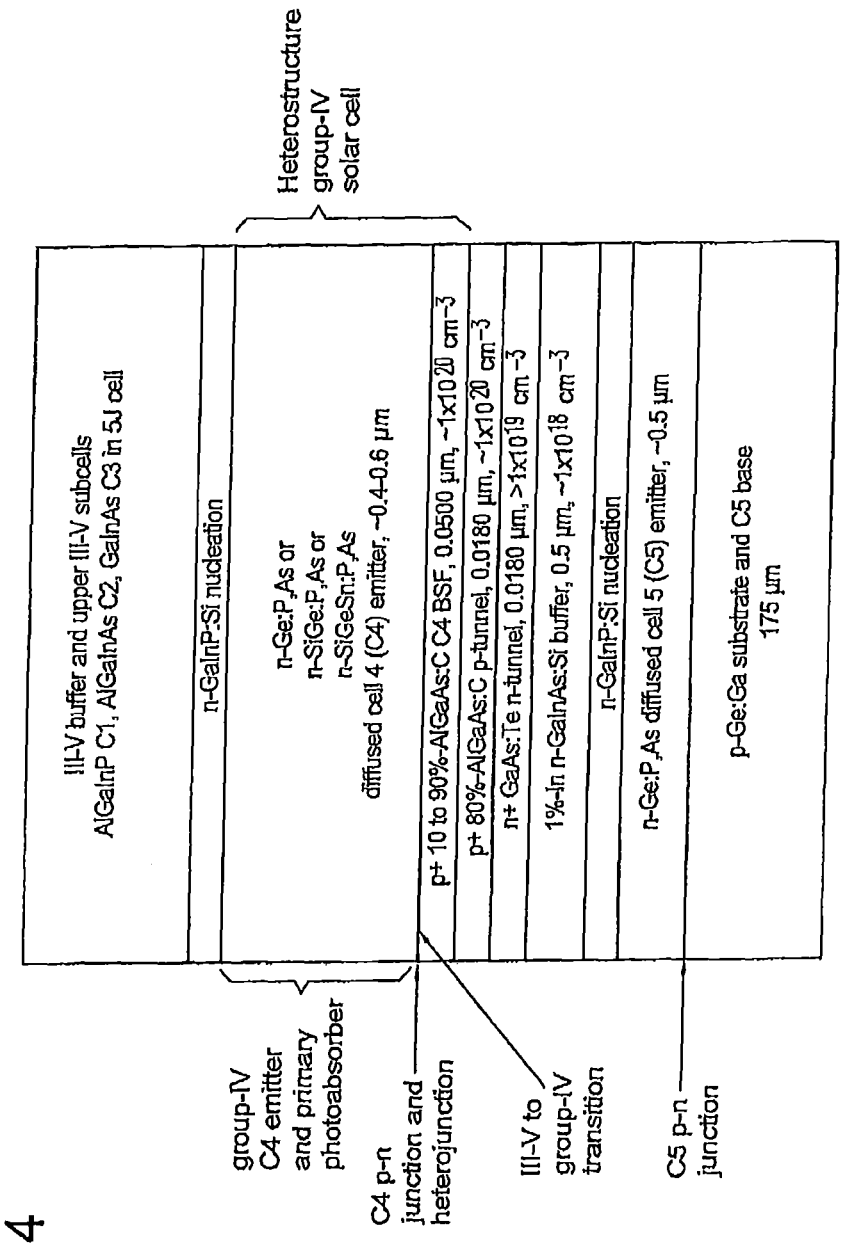
Figure 5:
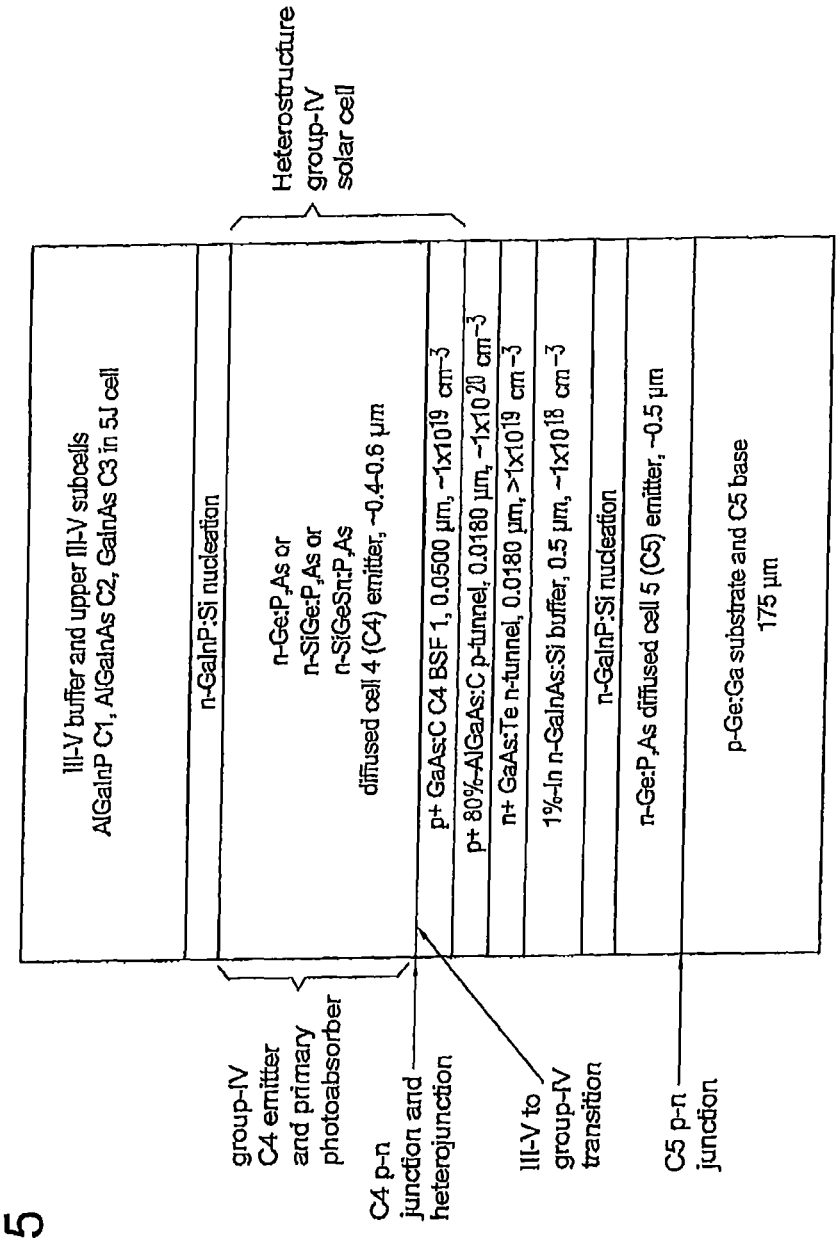
Figure 6:
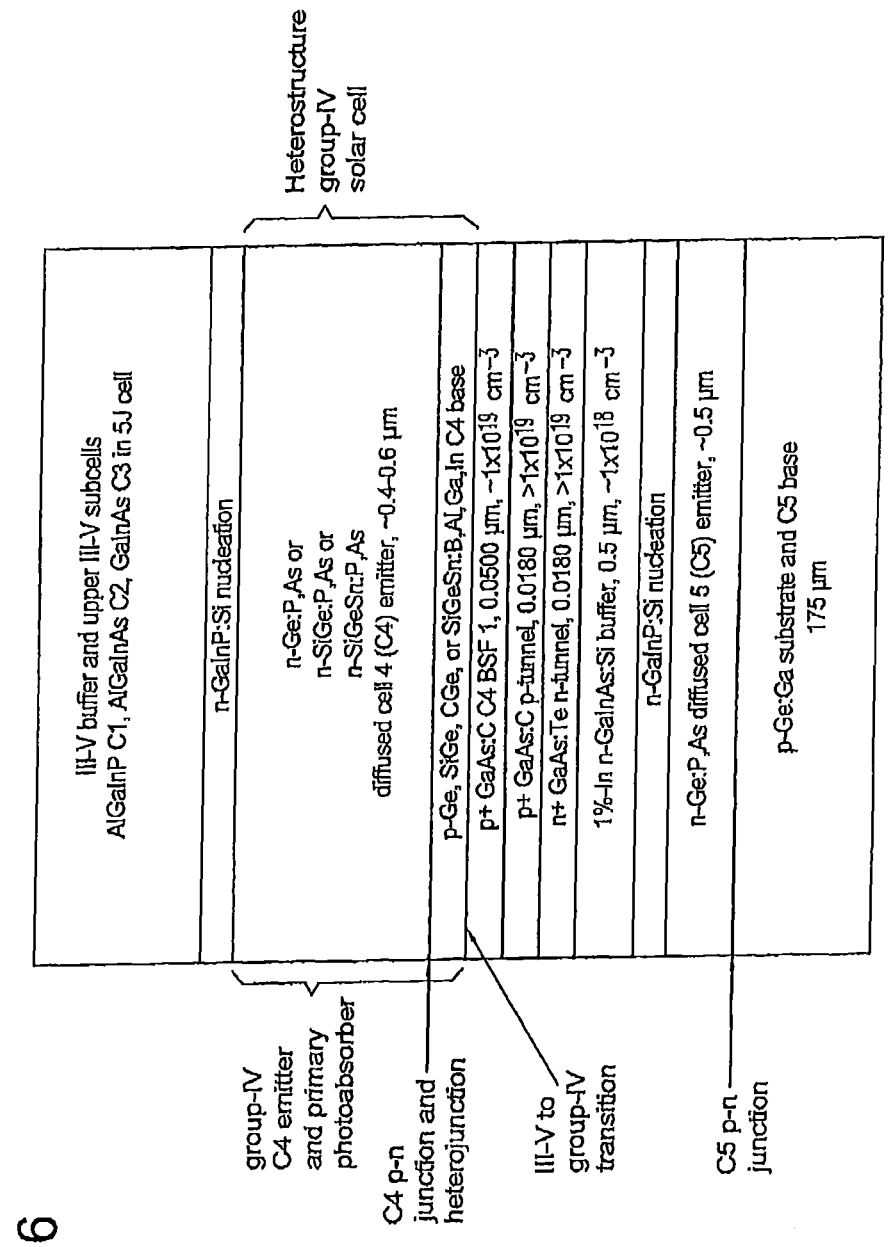
Figure 7:
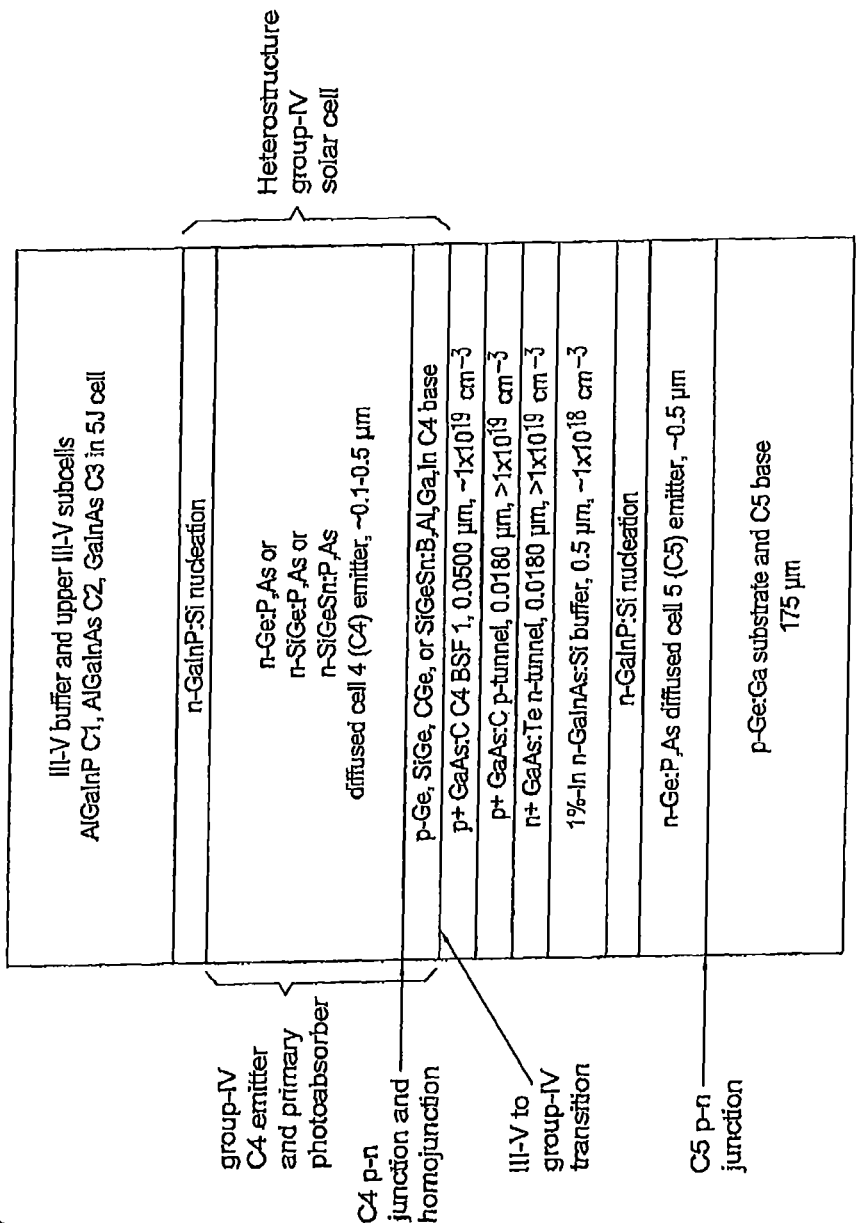
Figure 8:
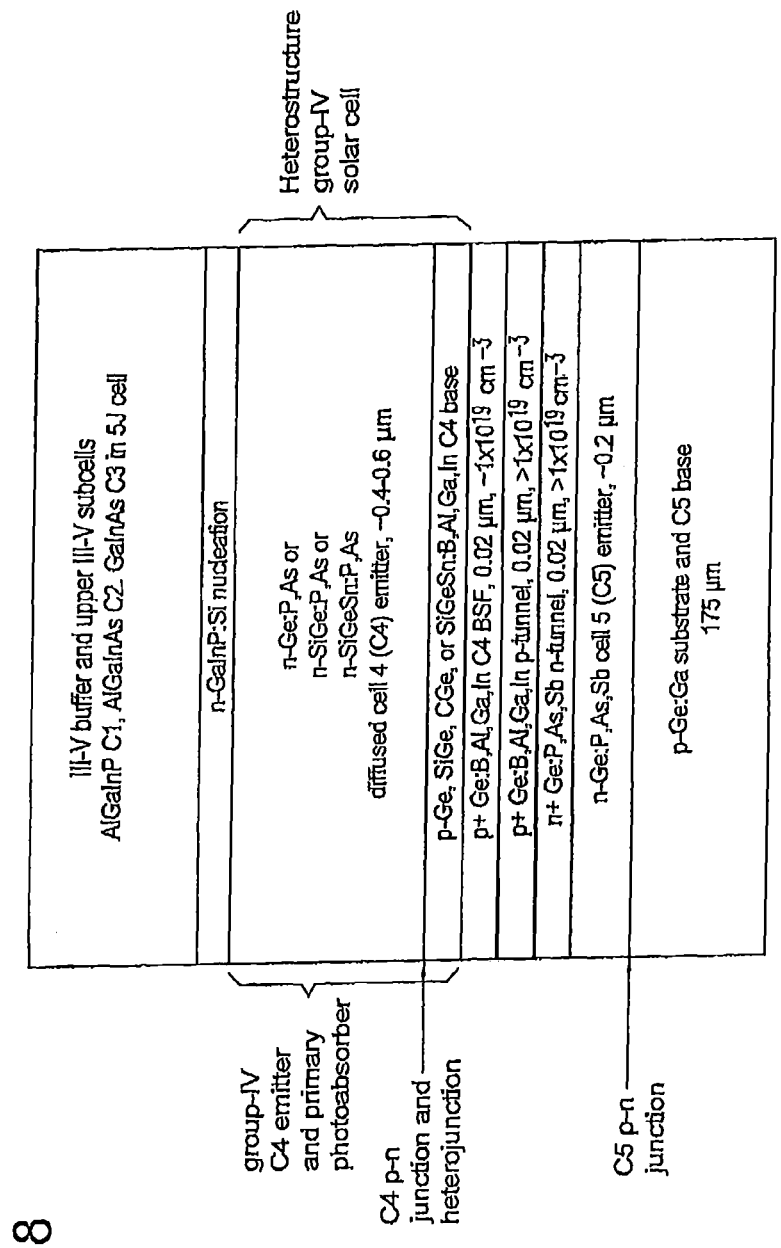
Figure 9:
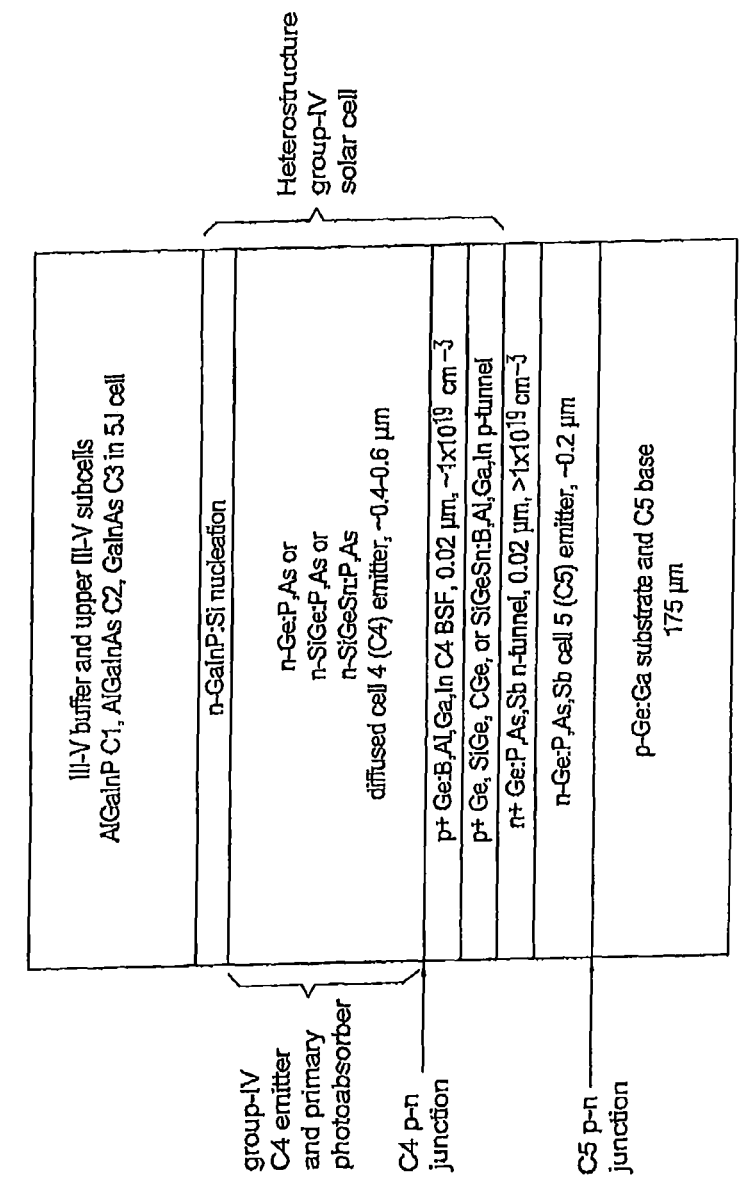
Figure 10:
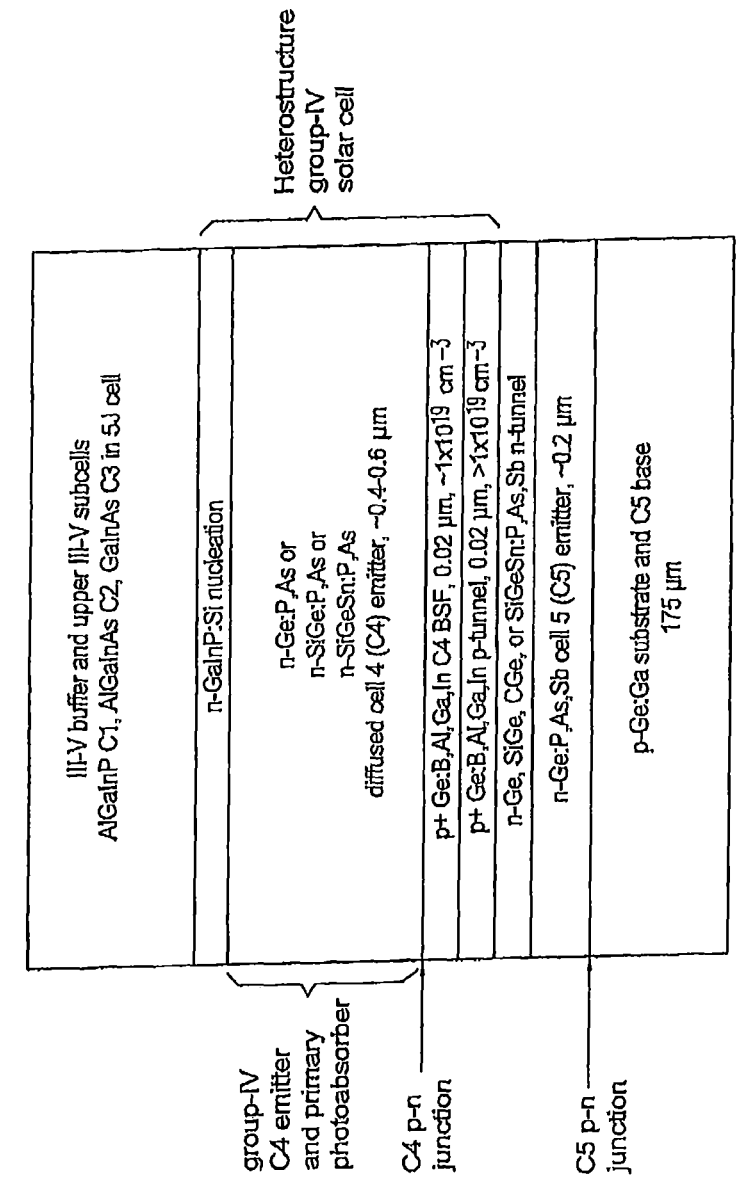
Figure 11:
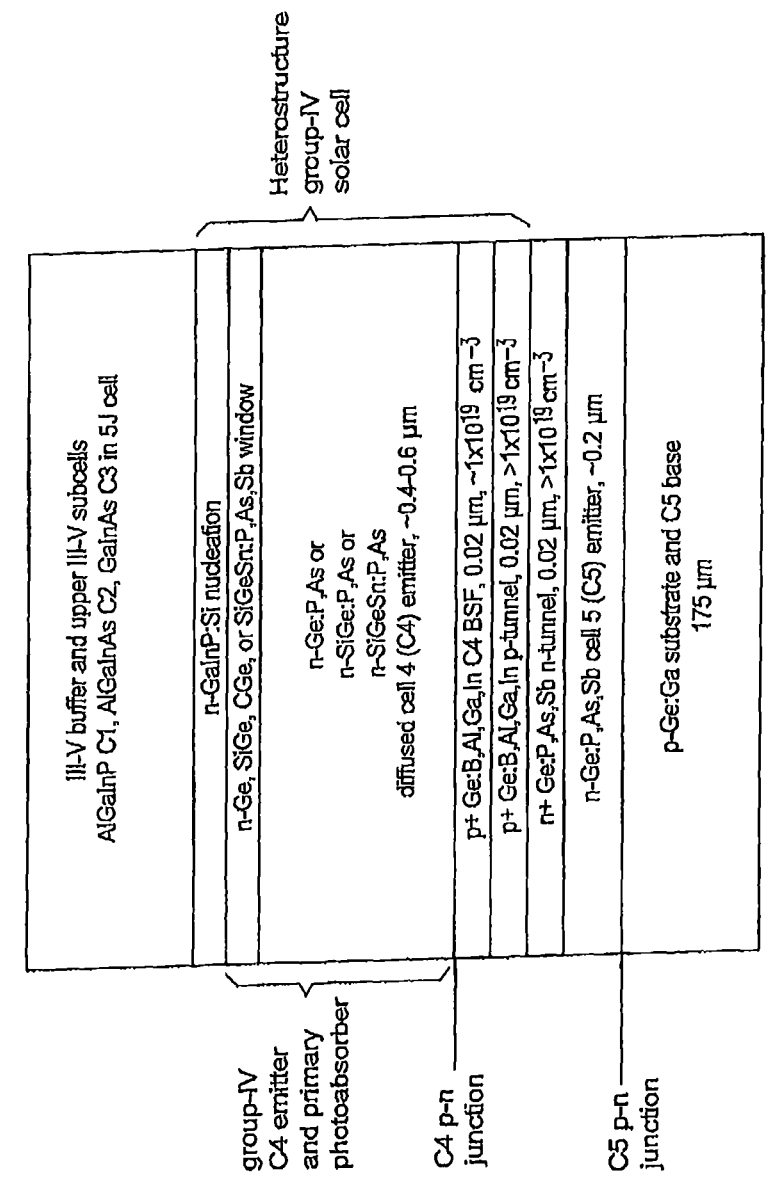
Figure 12:
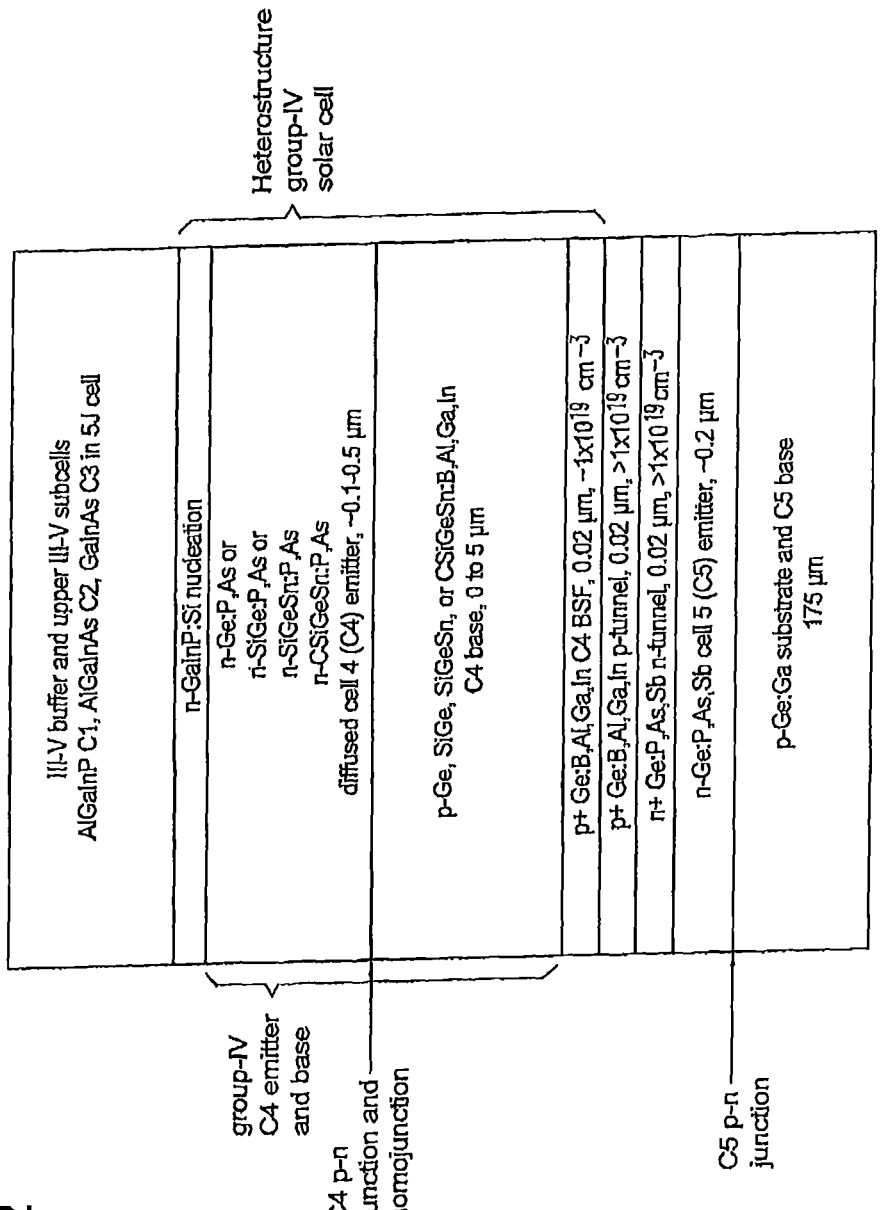
Figure 13:
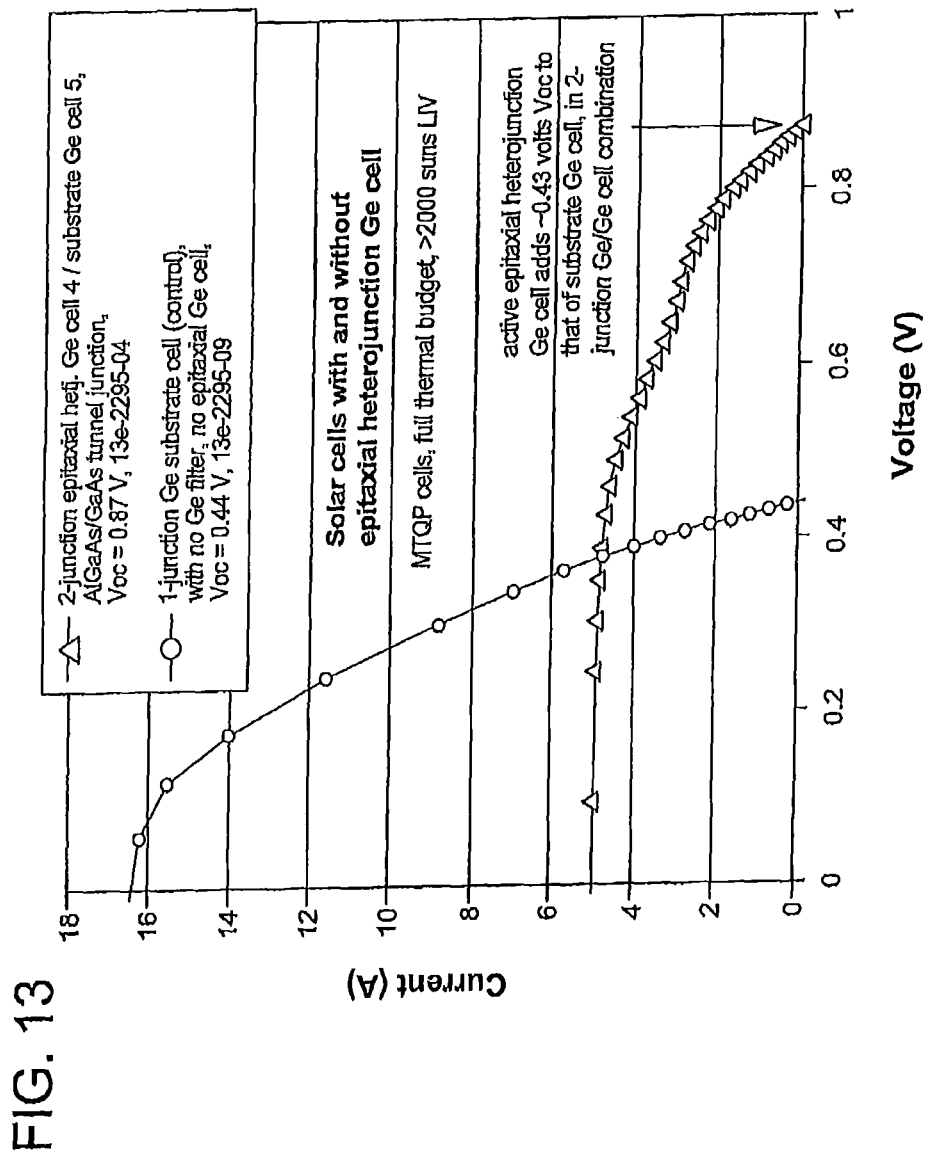
Figure 14:
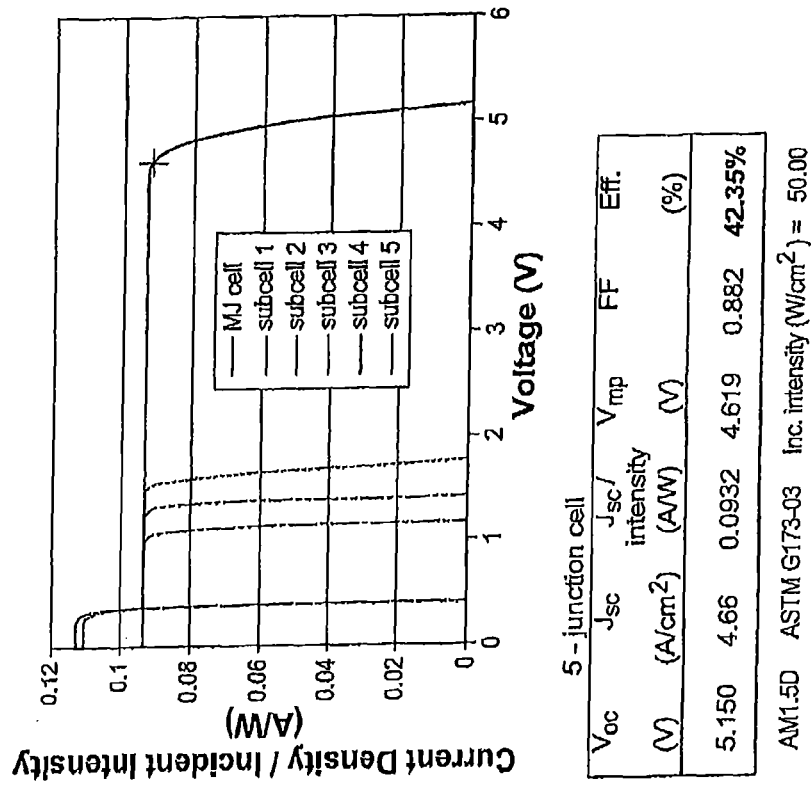
Figure 14:
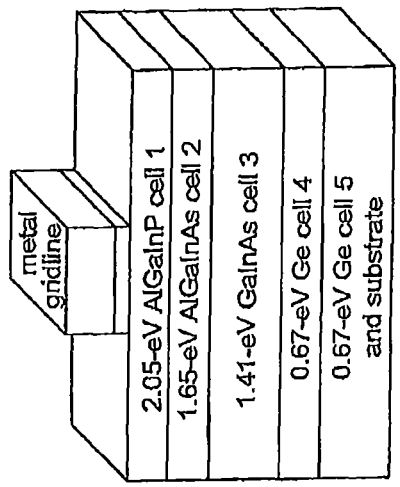
Figure 16:
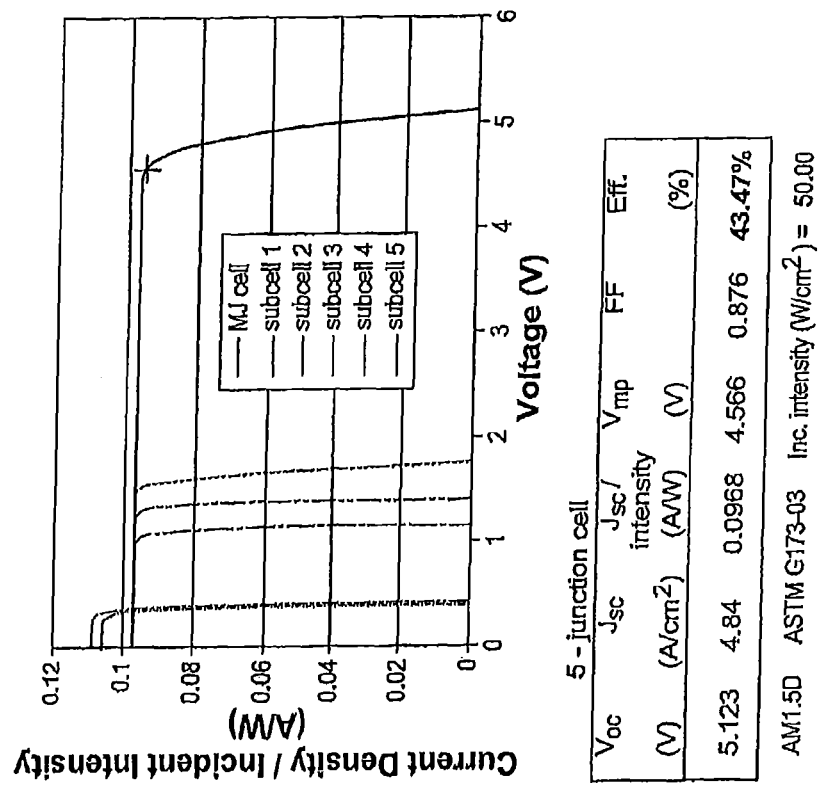
Figure 16:
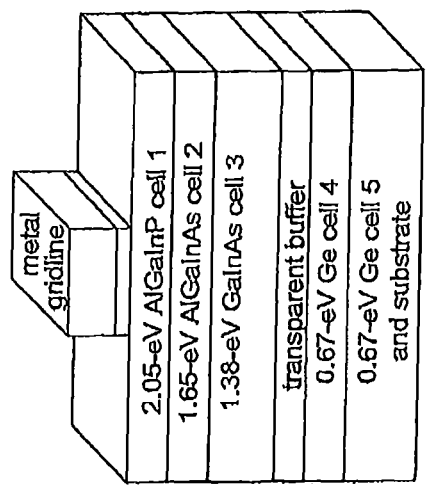
Figure 17:
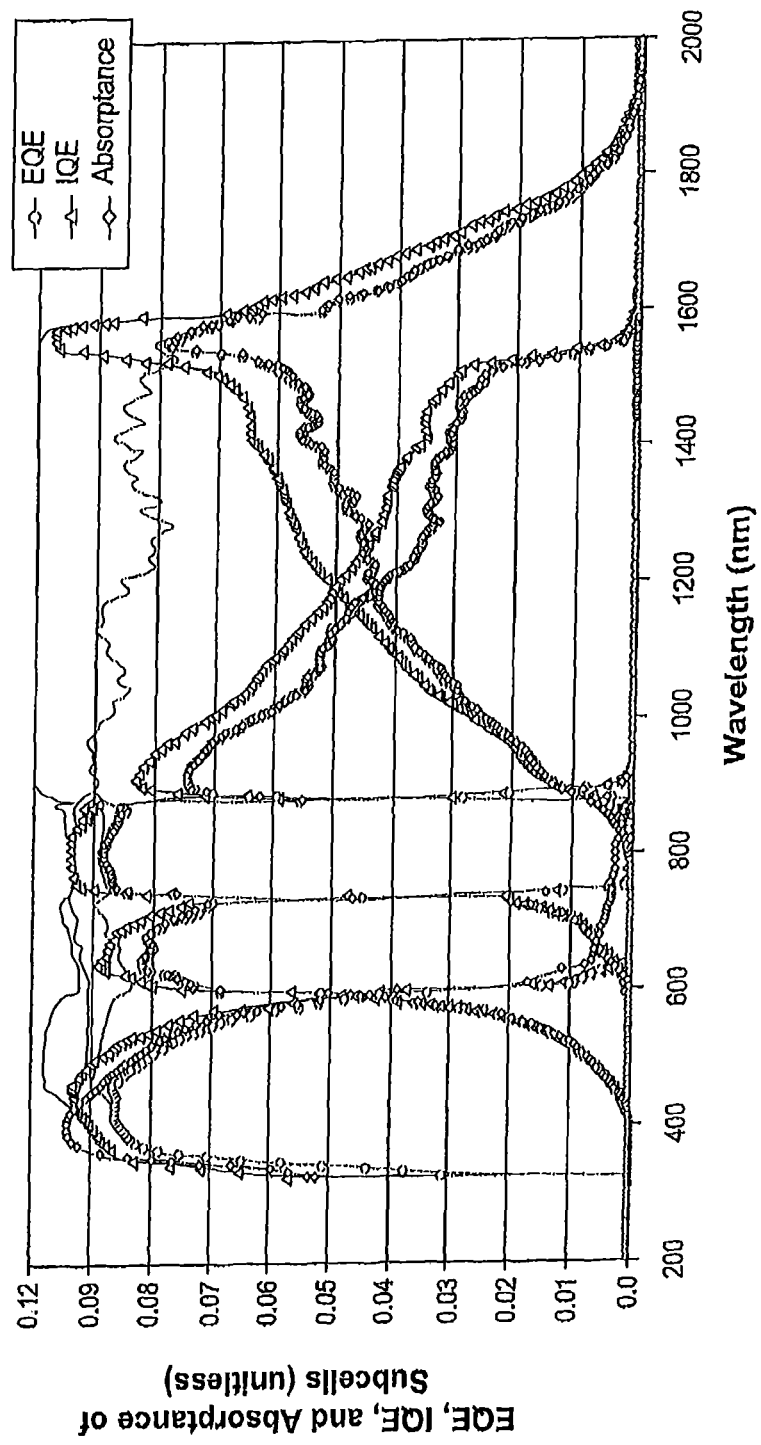
Figure 18:
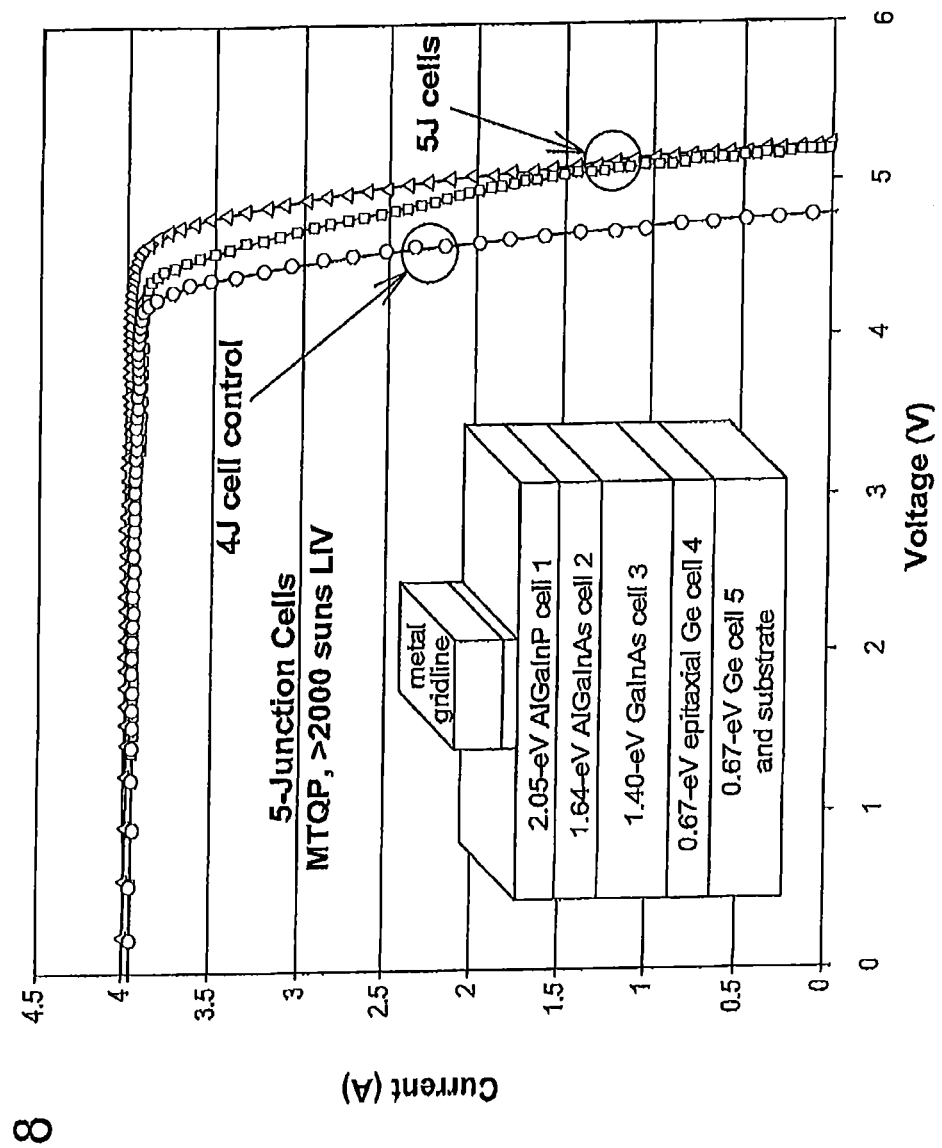

FIG. 4 is a cross-sectional diagram of an example group-IV solar cell where the primary absorber is an n-type Ge, SiGe or SiGeSn emitter layer that may be doped by group-V elements from the III-V semiconductor layers beneath it and group-V elements from III-V semiconductor layers above it (as well as by group-III elements present), and that forms the p-n junction of the solar cell at a heterostructure between the n-type Ge, SiGe or SiGeSn emitter and the p-type AlGaAs base or BSF layer;

FIG. 5 is a cross-sectional diagram of an example group-IV solar cell where the primary absorber is an n-type Ge, SiGe or SiGeSn emitter layer, forming the p-n junction of the solar cell at a heterostructure with a general p-type III-V semiconductor base or BSF layer (p-GaAs:C shown in the figure) and that incorporates a general III-V semiconductor p-type tunnel junction layer (80%-AlGaAs:C shown in the figure) and a general III-V semiconductor n-type tunnel junction layer (GaAs:Te shown in the figure);

FIG. 6 is a cross-sectional diagram of an example group-IV solar cell where the primary absorber is an n-type Ge, SiGe or SiGeSn emitter layer that may be doped by group-V elements from the III-V semiconductor layers beneath it and group-V elements from III-V semiconductor layers above it, and that forms the p-n junction of the solar cell at a heterostructure between the n-type Ge, SiGe or SiGeSn emitter and the p-type group-IV base or BSF layer with different composition than the n-type emitter;

FIG. 7 is a cross-sectional diagram of an example group-IV solar cell where the primary absorber is an n-type Ge, SiGe or SiGeSn emitter layer that may be doped by group-V elements from the III-V semiconductor layers beneath it and group-V elements from III-V semiconductor layers above it, and that forms the p-n junction of the solar cell at a homojunction between the n-type Ge, SiGe or SiGeSn emitter and the p-type group-IV base or BSF layer having substantially the same composition as the n-type emitter;

FIG. 8 is a cross-sectional diagram of an example group-IV solar cell where the primary absorber is an n-type Ge, SiGe or SiGeSn emitter layer that may be doped by group-V elements from the III-V semiconductor layers beneath it and group-V elements from III-V semiconductor layers above it, and where an upper epitaxial IV cell is interconnected in series to a lower substrate group-IV solar cell with a group-IV tunnel junction;

FIG. 9 is a cross-sectional diagram of an example upper group-IV solar cell, such as, for example, an epitaxial Ge solar cell interconnected to a second, lower group-IV cell via a tunnel junction, where the p-type side of the tunnel junction comprises a group-IV semiconductor having a different composition than the group-IV emitter, base, BSF or n-type side of the tunnel junction, thereby forming a heterostructure;

FIG. 10 is a cross-sectional diagram of an example upper group-IV solar cell, such as, for example, an epitaxial Ge solar cell interconnected to a second, lower group-IV cell via a tunnel junction, where the n-type side of the tunnel junction comprises a group-IV semiconductor having a different composition than the group-IV emitter, base, BSF or p-type side of the tunnel junction, thereby forming a hetero structure;

FIG. 11 is a cross-sectional diagram of an example upper group-IV solar cell, such as, for example, an epitaxial Ge solar cell with a window layer comprising a group-IV semiconductor such as, for example, Ge, SiGe, CGe, SiGeSn and/or CSiGeSn with a different semiconductor composition than the emitter, forming a heterostructure;

FIG. 12 is a cross-sectional diagram of an example solar cell structure, where an upper group-IV subcell has a higher bandgap than a lower group-IV subcell, optionally allowing the upper subcell to be optically thicker than if both subcells had the same bandgap, and optionally allowing part of the upper group-IV subcell to be an undiffused p-type base in the finished device. Examples include using SiGe, CGe, SiGeSn, or CSiGeSn for the main absorber layer of the upper subcell, and Ge for the lower subcell;

FIG. 13 is a graph plotting experimental, measured light I-V curves of a 2-junction (2J) Ge/Ge subcell with an interconnecting AlGaAs/Ga? As tunnel junction with both subcells active in a structure similar to that shown in FIG. 4 with an epitaxially-grown Ge absorber layer in the upper group-IV subcell, showing the voltage addition associated with the series interconnection of both active group-IV subcells. A single-junction (1J) Ge subcell formed in the Ge substrate is also plotted for comparison. The 2-junction Ge/Ge cell structure results in approximately twice the voltage of the 1-junction Ge cell, with over 0.4 V higher open-circuit voltage $V_{oc}$ for the 2J Ge/Ge cell compared to the 1J cell;

FIG. 14 is a cross-sectional diagram and graph showing calculated subcell and multijunction cell light I-V curves and calculated light I-V parameters for a 5-junction (5J) AlGaInP/AlGaInAs/GaInAs/Ge/Ge solar cell using an epitaxial Ge cell 4 and a 2-junction Ge/Ge combination for the bottom two cell layers;

FIG. 15 cross-sectional diagram and graph showing calculated subcell and multijunction cell light I-V curves and calculated light I-V parameters for a 5-junction (5J) with an epitaxial Ge cell 4 and a 2-junction Ge/Ge cell configuration at the bottom of the stack, and with energy wells to lower the effective bandgap of subcell 3;

FIG. 16 is a cross-sectional diagram and graph showing calculated subcell and multijunction cell light I-V curves and calculated light I-V parameters for a 5-junction (5J) cell using an epitaxial Ge cell 4 and a 2-junction Ge/Ge cell configuration at the bottom of the stack, and with a metamorphic structure to lower the bandgap of subcell 3;

FIG. 17 is a graph showing calculated external quantum efficiency (EQE), internal quantum efficiency (IQE), and an overall absorptance for a 5-junction cell incorporating an epitaxial heterojunction Ge cell 4, with an AlGaInP/AlGaInAs/GaInAs/epitaxial Ge/substrate Ge cell structure, with a base bandgap combination of 2.05/1.68/1.41/0.67/0.67 eV;

FIG. 18 is a graph showing measured light I-V characteristics of two fully-integrated prototype 5-junction (5J) cells, incorporating a heterojunction epitaxial Ge cell 4, with structure as shown in the cross-sectional cell schematic. 4-junction (4J) cells with an identical structure except that the epitaxial Ge cell 4 and associated tunnel junction are absent are also shown for comparison. The epitaxial Ge cell 4 in the 5J cells results in an ~0.4 V higher open-circuit voltage $V_{oc}$ for the 5J cells compared to the 4J cells.

DETAILED DESCRIPTION

According to the present disclosure, systems and methods are disclosed for making significant improvements for terrestrial and non-terrestrial photovoltaic cells, such as, for example, concentrator solar cells and space solar cells, providing significantly higher efficiency than are available in today's most advanced solar cells. The approaches described herein make use of the lower-cost, more reliable, and more scalable processes of upright solar cell growth, and lattice-matched growth or metamorphic growth with small lattice mismatch, as opposed to the inverted cell growth and cell processing, and metamorphic growth with high lattice mismatch of inverted metamorphic cells.

The present disclosure allows the formation of multijunction cells, such as, for example, 3-junction (3J), 4-junction (4J), 5-junction (5J), 6-junction (6J), 7-junction (7J) solar cells, or cells with 8 junctions or more, that incorporate a group-IV solar cell. Preferred cells comprise, for example, epitaxial Ge, Si, SiGe, CGe, GeSn, SiGeSn, CSiGe, CGeSn, CSiGeSn, etc. to provide the desired, pre-selected subcell bandgap combination, thus increasing the efficiency of the multijunction cell. Such group-IV solar cells at least one layer comprising at least one element from column IV (four) of the periodic table of elements, e.g., carbon (C), silicon (Si), germanium (Ge), and tin (Sn). The group-IV layer in the solar cell may be a primary photogeneration layer, or primary absorber layer, such that the majority of charge carrier photogeneration for the solar cell takes place in the primary absorber layer.

The approaches described herein make use of the low-cost, reliable, and scalable processes of upright solar cell growth, and lattice-matched growth or metamorphic growth with small lattice mismatch. These processes have certain advantages compared with inverted cell growth and cell processing, and metamorphic growth with high lattice mismatch, associated with other high-efficiency solar cell architectures, such as, for instance, inverted metamorphic cells.

According to the present disclosure, the heterostructure layers are designed to reduce minority-carrier recombination at interfaces, and be more transparent to light in layers where photogeneration is undesirable, such as, for example, tunnel junction layers, window layers, base or BSF layers, and other layers in which the collection probability of photo-generated carriers is low.

Further, according to the present disclosure, dopant or other impurity diffusion from one layer to another is engineered or managed. In cases where it is desirable, doping of group-IV semiconductor layers by nearby III-V semiconductors, and doping of III-V semiconductor layers by nearby group-IV semiconductors, is used to form the final doping of some solar cell layers. In other cases for which doping caused by adjacent layers is undesirable, dopant or other impurity diffusion from one layer to another is inhibited by choice of the layer structure, compositions, growth conditions, and processing conditions.

Moreover, according to the present disclosure, when such group-IV layers are incorporated into multijunction cells with III-V semiconductor layers, the group-III and group-V elements in the III-V semiconductors will typically dope nearby group-IV layers. Similarly, the group-IV elements will dope the III-V semiconductor layers. Such doping between semiconductor layers from different columns of the periodic table, referred to herein as cross-doping, is often difficult to avoid and results in compromised cell efficiency for some cell designs. However, the cell designs disclosed herein use particular groupings of multijunction solar cell device design architectures with regard to: n-type or p-type doping type and doping concentration, semiconductor family (group-IV semiconductors, III-V semiconductors, II-VI semiconductors, etc.), semiconductor material compositions and lattice constant, location in the multijunction stack, selection of adjacent semiconductor layers, semiconductor growth conditions and thermal budget and annealing conditions that influence the incorporation and movement of dopant atoms, crystal lattice strain, relaxation, and dislocations, and other parameters as described in the present disclosure to accommodate such cross-doping and use it to advantage to result in the final doping of the solar cell layers, resulting in a solar cell having significantly improved voltage and efficiency.

In addition, according to the present disclosure, better use is also made of the excess photogenerated current in the Ge bottom subcell as compared with conventional lattice-matched GaInP/GaInAs/Ge 3-junction solar cells. Another cell type that makes better use of the excess photogenerated current density in the Ge bottom subcell of conventional 3J cells is represented by inverted metamorphic solar cells such as GaInP/GaAs/GaInAs 3J cells. However, this approach has significantly higher growth cost and processing cost than the upright processing and lattice-matched growth approaches described and disclosed herein. For example, the present disclosure also contemplates, for example, using dilute nitride GaInNAs(Sb) subcells with ~1-eV bandgap in multijunction cells as another method for achieving a better division of the solar spectrum in the long wavelength range of the solar spectrum. However, such dilute-nitride cells have historically had unacceptably low current density, voltage, or both to be used in this way, unless higher cost growth methods are used.

The term group-IV solar cell refers to a solar cell having at least one layer comprising one or more group-IV elements, e.g., C, Si, Ge, and Sn, individually, or in combination with other elements. The group-IV solar cell layer may be selected, for instance, from a group including the semiconductor compositions of Ge, Si, SiGe, CGe, GeSn, SiGeSn, CSiGe, CGeSn, or CSiGeSn. The GaInP nucleation layer on the group-IV solar cell in many of the diagrams below can be used as a window layer on the cell in addition to serving as a nucleation layer. The abbreviations C1, C2, C3, C4, C5, etc. refer to subcell or cell 1 (the top subcell), and subcells or cells 2, 3, 4, 5, etc., respectively, beneath the top cell in normal operation of a multijunction solar cell. The abbreviations 1J, 2J, 3J, 4J, 5J, 6J, 7J, etc, refer to 1-junction, 2-junction, 3-junction, 4-junction, 5-junction, or 6-junction, 7-junction, etc., solar cells.

Some variants of the present disclosure will now be described more fully hereinafter with reference to the accompanying drawings, in which some, but not all variations of the disclosure are shown. Indeed, the present disclosure may be embodied in many different forms and should not be construed as limited to the variations set forth herein. Instead, these illustrative variations are provided so that this disclosure will be thorough and complete, and will fully convey the scope of the disclosure to those skilled in the art. For example, unless otherwise indicated, referencing something as being a first, second or the like should not be construed to imply a particular order. Also, something may be described as being "above" something else and, unless otherwise indicated, may instead be "below", and vice versa. Similarly, something described as being to the left of something else may instead be to the right, and vice versa. Like reference numerals refer to like elements throughout.

Therefore, preferred embodiments according to the present disclosure include a group-IV solar cell that is optically thin in order to leak a substantial, amount of light to an additional subcell layer beneath, such as, for example, an epitaxially-grown Ge, SiGe, CGe, GeSn, SiGeSn, or CSiGeSn subcell on top of a Ge substrate subcell in a multijunction solar cell, in which most or substantially all of the photoabsorbing group-IV layer in the solar cell is doped n-type by the growth of III-V subcells on top and/or by III-V semiconductor layers on which the group-IV solar cell is grown, such that the p-n junction is formed at the back of the main photoabsorbing group-IV layer.

An optically thin solar cell is one which transmits a non-zero amount of the light incident upon it to layers beneath the solar cell, i.e., to layers on the opposite side of the subcell from the light source. Typically, an optically thin subcell will transmit an amount of incident light in the range of approximately 5% to 90% of the light intensity or equivalent photogenerated current density that could in principle be used by a solar cell with that bandgap. The light intensity or equivalent photogenerated current density that could in principle be used by a solar cell with a given bandgap, is the light in the spectrum incident on the cell—including the effects of any light filtering above the cell, for instance, from other subcells in a multijunction solar cell stack—with photon energy high enough to produce carrier photogeneration in the solar cell, i.e., higher than approximately the solar cell bandgap. More typically, the range of the amount of light transmitted by an optically thin solar cell is approximately 10% to 70%, and will depend on the desired use of the light transmitted by the solar cell, for instance, by the specific bandgap combination of subcells in a multijunction cell beneath the optically thin subcell. For many of the solar cell designs in the present disclosure, in which an upper group-IV solar cell and a lower group-IV solar cell are to share the available photogenerated current density equally, in order for the upper and lower subcells to be current matched in a multijunction solar cell, the upper, optically thin cell will preferably have a range of the amount of transmitted light of approximately 40% to 65%, and more preferably 45% to 60%, and still more preferably 48% to 56%. The desired amount of light to be transmitted by the optically thin upper subcell depends on non-ideal effects in the solar cell structure, such as absorption by intervening layers like the tunnel junction layers between the upper and lower subcell, and incomplete collection of photogenerated carriers in the lower subcell.

Further examples include a group-IV photovoltaic cell, such as, for example a solar cell where the main or primary photoabsorbing layer is an epitaxially-grown Ge, SiGe, CGe, GeSn, SiGeSn, or CSiGeSn n-type emitter layer, doped n-type by the nucleation and growth of III-V semiconductors on top of it, from which photogenerated minority holes are collected at a p-n junction at the back of this n-type Ge, SiGe, CGe, GeSn, SiGeSn, or CSiGeSn emitter layer.

In addition, the present disclosure contemplates a photovoltaic cell arrangement with the n-type Ge, SiGe, CGe, GeSn, SiGeSn, or CSiGeSn emitter solar cell described above, and preferably having a thickness in the range of from about 0.01 to about 10 microns, more preferably in the range of from about 0.1 to about 2 microns, and still more preferably in the range of from about 0.3 to about 0.7 microns.

Figure 1:
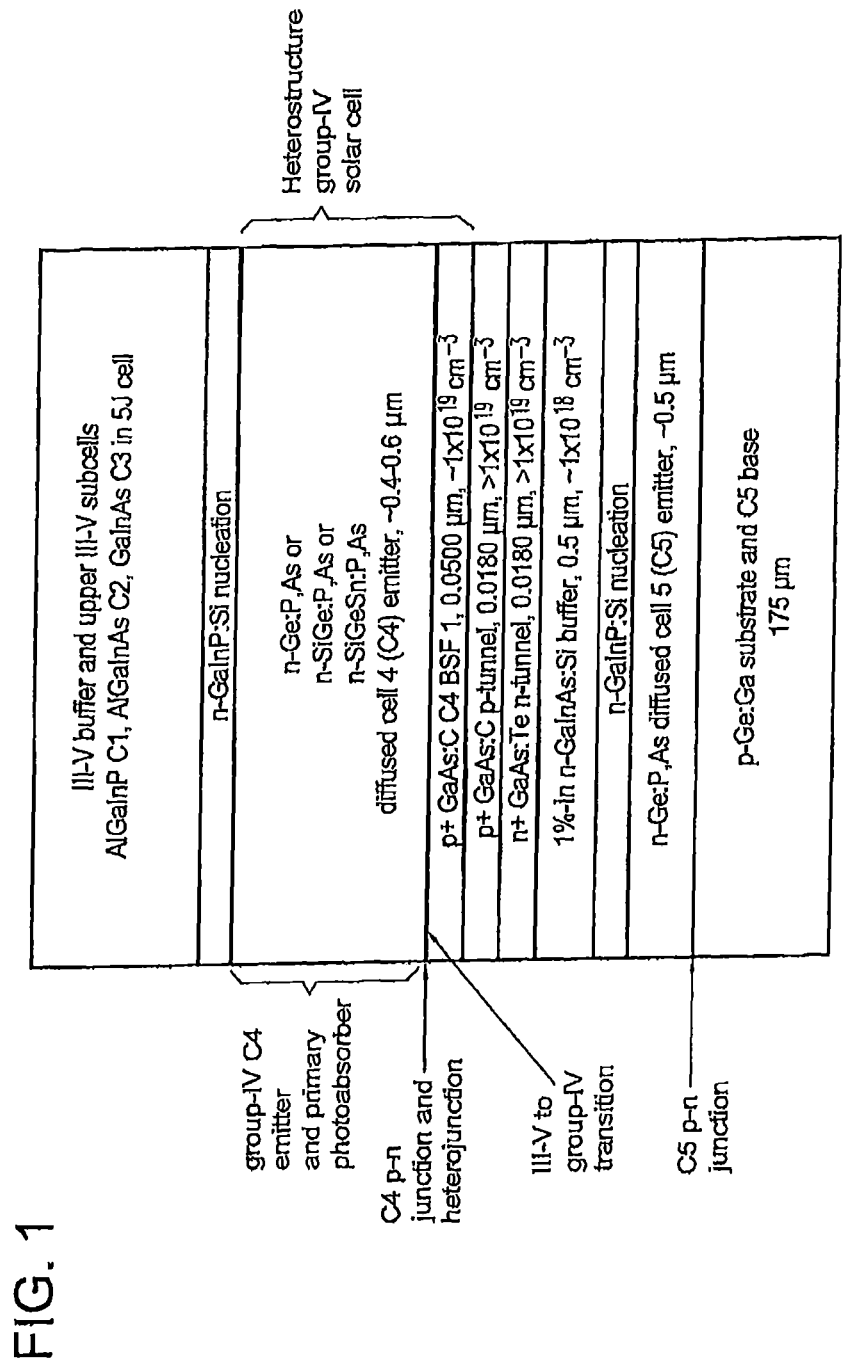

Further, the present disclosure contemplates a photovoltaic cell arrangement with the n-type Ge, SiGe, CGe, GeSn, SiGeSn, or CSiGeSn emitter solar cell described above, and where the p-n junction at the back of the emitter layer is formed by a p-type III-V layer that renders ineffective the n-type doping that diffuses in from the front of the cell (since the group-V elements that cause n-type doping and group-III elements that cause p-type doping in group-IV semiconductors are not dopants in III-V semiconductors). As shown in FIG. 1, the n-type Ge, SiGe, CGe, GeSn, SiGeSn, or CSiGeSn emitter solar cell is located above the lower subcell, where above indicates a direction toward the primary light source for the solar cell, e.g., the sun, where the p-n junction at the back of the emitter layer is a heterojunction between the n-type group-IV emitter and a p-type III-V semiconductor base, back-surface-field (BSF), or back-heterostructure layer comprising a III-V semiconductor such as, but not limited to, GaAs, AlGaAs, GaInAs, GaInP, AlGaInAs, and AlGaInP. The n-type group-IV layer may be doped by group-V elements from III-V semiconductor layers beneath it and group-V elements from III-V semiconductors above it, and the n-type group-IV emitter layer forms the p-n junction of the solar cell at a heterostructure between the n-type Ge, SiGe, CGe, GeSn, SiGeSn, or CSiGeSn emitter and p-type GaAs base or BSF layer. Furthermore, the heterostructure formed between the group-IV emitter and the III-V semiconductor base, BSF, or back-heterostructure in FIG. 1 is a cross-column heterostructure.

The III-V semiconductor base, BSF, or back-heterostructure layer material, and indeed the material of any or all the III-V semiconductor layers described in various configurations the semiconductor devices of the present disclosure, may be chosen from a preferred group including, but not limited to: GaAs, AlGaAs, GaInAs, AlGaInAs, InP, GaP, GaInP, GaInPAs, AlInP, AlGaInP, InAs, InPAs, AlInAs, AlAs, GaSb, GaAsSb, InSb, GaInAsSb, GaInNAs, GaInNAsSb, GaN, AlN, InN, GaInN, AlGaN, AlInN, AlGaInN, and combinations thereof.

In general, a back-surface-field (BSF) layer may have the same bandgap as the base layer, or it may have a different bandgap than the base layer, in which case the BSF layer is also a back-heterostructure layer. The solar cell BSF layer typically has the same doping type as the solar cell base. The BSF layer is often, but not always, doped at a higher doping concentration with respect to the base layer in order to suppress the concentration of minority-carriers and suppress their rate of recombination in the BSF layer. The BSF layer often, but not always, has a higher bandgap with respect to the base layer in order to suppress the concentration of minority-carriers and suppress their rate of recombination in the BSF layer.

In general, a cross-column heterostructure is a heterostructure formed between: a first semiconductor layer on a first side of the heterostructure comprising a first family of semiconductors formed from elements from a given column or set of columns of the periodic table of elements, and; a second semiconductor layer on the opposite, second side of the heterostructure comprising a second family of semiconductors different from the first family of semiconductors of the first semiconductor layer, formed from elements from a column or different set of columns of the periodic table, where the family of semiconductors for each layer may be selected from a group including, but not limited to: group-IV semiconductors; III-V semiconductors; II-VI semiconductors; semiconductors; II-IV-VI semiconductors; and other families, where the roman numerals refer to the number of a column of elements in the periodic table of elements.

Figure 2:
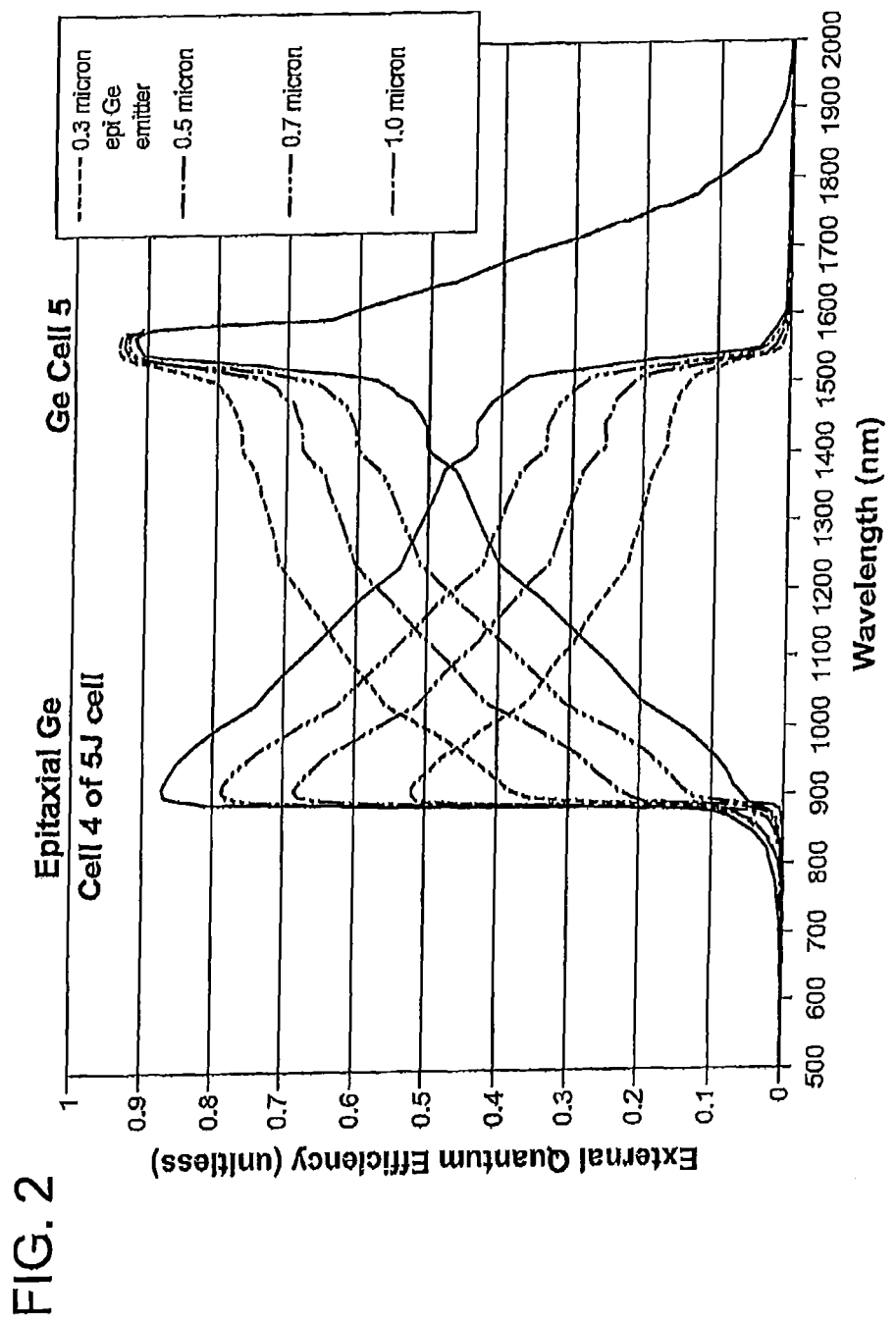
FIG. 2 is a graph showing calculated quantum efficiencies of a thin, epitaxial Ge subcell 4 in a 5-junction cell, and of an optically thick lower Ge substrate cell 5 in a 5-junction cell showing the behavior of the resulting current balance among these subcells as a function of upper subcell thickness.
Figure 3:
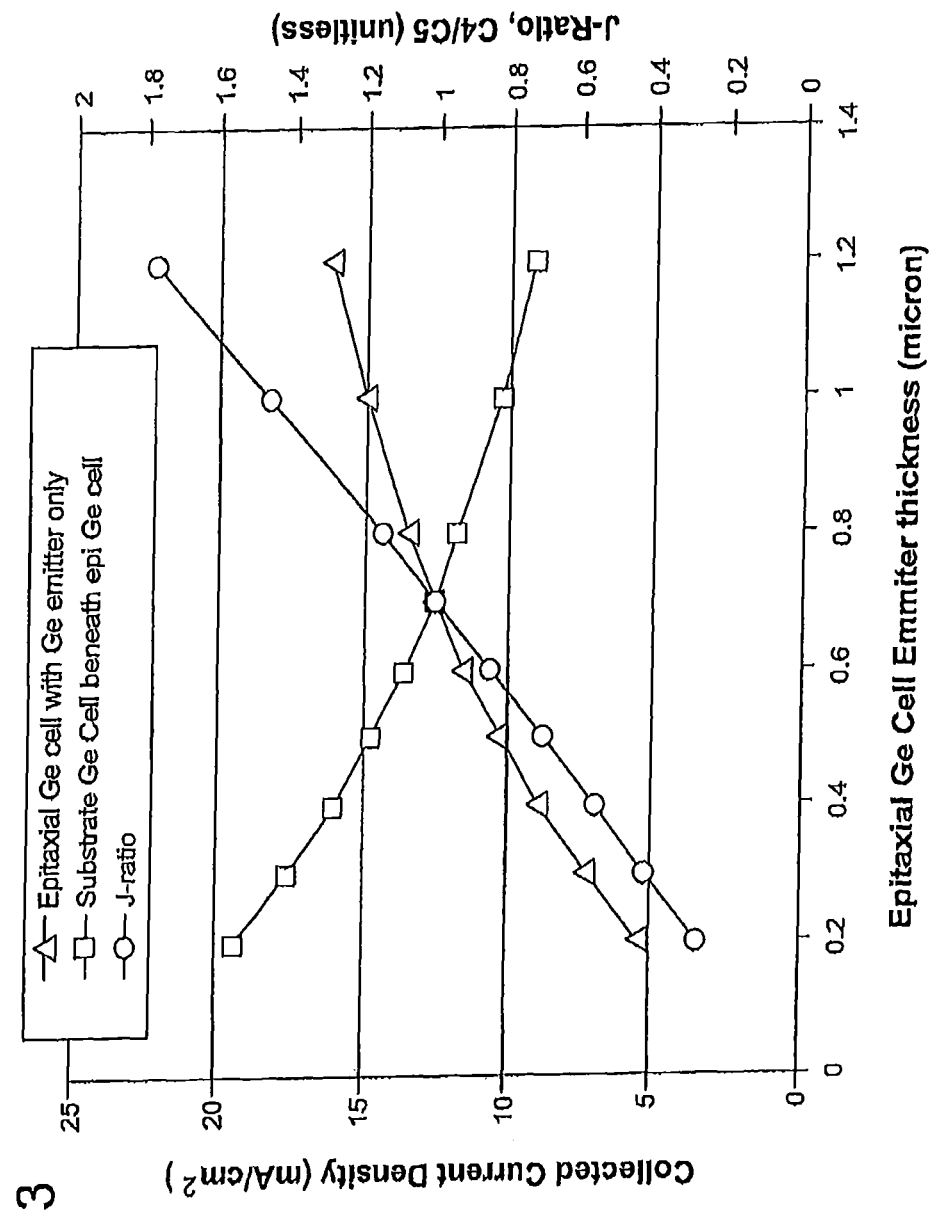
FIG. 3 is a graph showing calculated densities of both upper and lower group-IV subcells from FIG. 2 and the ratio of their currents (J-ratio) plotted as a function of upper group-IV subcell absorber thickness.

Still further, the present disclosure contemplates an upper group-IV solar cell that is optically thin, that transmits roughly half of the light energy incident upon it to a second lower group-IV solar cell positioned beneath the first, upper group-IV cell, such that it is in optical series with the first cell. The upper group-IV cell and the lower group-IV cell may be connected in electrical series by a tunnel junction preferably made as transparent as possible to the wavelengths used by the second, lower cell. As shown in FIG. 2, calculated quantum efficiencies of a thin, upper, epitaxial Ge subcell 4 in a 5J cell, and of an optically thick, lower Ge substrate subcell 5 in a 5J cell, are plotted as a function of wavelength for various upper subcell thicknesses using Ge absorption coefficients. The behavior of the resulting current balance among these subcells for various upper subcell thicknesses can be seen in FIG. 2 as a function of upper subcell thickness. The current densities of both the upper and lower group-IV subcells from FIG. 2, and the ratio of their currents, called the J-ratio, is plotted as a function of upper group-IV subcell absorber thicknesses in FIG. 3.

FIG. 4 shows a cross-sectional diagram of an example-IV solar cell for which the primary photoabsorber is an n-type Ge, SiGe, or SiGeSn emitter layer, which may be doped by group-V elements from III-V semiconductor layers beneath it and group-V elements from III-V semiconductors above it, and which forms the p-n junction of the solar cell at a heterostructure between the n-type Ge, SiGe, or SiGeSn emitter and p-type AlGaAs base or BSF layer. The high p-type carbon doping level in the 1×1020 cm$^{-3}$ range that is readily achievable in AlGaAs, (as compared to GaAs), is beneficial to that structure, since highly doped p-type layers are more resistant to unwanted doping from Ge diffusing in from nearby Ge layers. Such an arrangement maintains a solar cell p-n junction between the n-Ge and p-AlGaAs, and maintains a tunnel junction with high doping on both sides of, for instance, a p-AlGaAs/n-GaAs tunnel junction.

FIG. 5 shows another preferred arrangement with the n-type Ge, SiGe, or SiGeSn emitter solar cell described above, that may be doped by group-V elements from III-V semiconductor layers beneath it and group-V elements from III-V semiconductors above it, where the p-n junction at the back of the emitter layer is a heterojunction between the n-type group-IV emitter and a p-type III-V semiconductor base or BSF layer, such as GaAs, AlGaAs, GaInP, or AlGaInP, and which incorporates a III-V tunnel junction for which the p-type side of the tunnel junction may be composed of a III-V semiconductor such as GaAs, AlGaAs, GaInP or AlGaInP, and for which the n-type side of the tunnel junction may also be composed of a III-V semiconductor such as GaAs, AlGaAs, GaInP, or AlGaInP. One example is shown in FIG. 5, with an n-type Ge emitter and main absorber layer, a p-type GaAs base or BSF layer, and an AlGaAs:C p-type tunnel layer, and a GaAs:Te n-type tunnel layer. Where AlGaAs layers are used, the high p-type carbon doping level in the 1×10$^{20}$ cm$^{-3}$ range that is readily achievable in AlGaAs, (as compared to GaAs), is beneficial to the structure, since highly doped p-type layers are more resistant to unwanted dopant compensation from Ge diffusing in from nearby Ge layers, for instance, thus maintaining high doping levels on both sides of the p-AlGaAs/n-GaAs tunnel junction shown in FIG. 5.

According to contemplated alternatives, a solar cell structure where the tunnel junction between an upper group-IV subcell (C4), such as an epitaxial Ge subcell, and a lower group-IV subcell formed from the growth substrate (C5), such as a Ge growth substrate, is composed of III-V semiconductors, such as a p+GaAs/n+GaAs tunnel junction, a p+AlGaAs/n+GaAs tunnel, a p+AlGaAs/n+AlGaAs tunnel, p+AlGaAs/n+GaInP tunnel, as shown in FIGS. 1, 4, and 5.

The n-type Ge, SiGe, or SiGeSn emitter solar cell described above, where the p-type III-V semiconductor base or BSF layer is chosen to include specific group-III or group-V dopants in the group-IV solar cell on top of it that are desirable for the functioning of the group-IV solar cell, or to exclude specific group-III or group-V dopants in the group-IV solar cell on top of it that are undesirable for the functioning of the group-IV solar cell.

Further, the n-type Ge, SiGe, or SiGeSn emitter solar cell described above, where the p-type III-V semiconductor base or BSF layer is chosen from a preferred list including GaAs, AlGaAs, GaInAs, AlGaInAs, InP, GaP, GaInP, GaInPAs, InAs InPAs, AlInAs, AlAs, GaSb, GaAsSb, InSb, GaInAsSb, GaInNAs, GaInNAsSb and combinations thereof FIG. 6 shows still another preferred arrangement, with the n-type Ge, SiGe, or SiGeSn emitter solar cell described above, where the p-n junction at the back of the emitter layer is a heterojunction between the n-type group-IV emitter and a p-type group-IV base or BSF layer with different semiconductor composition than the group-IV emitter, such as an epitaxial n-type Ge emitter and main photoabsorber layer on a strained p-type SiGe base or BSF layer, or an epitaxial n-type Ge emitter on an unstrained p-type SiGeSn base or BSF with wider bandgap than the Ge emitter. More specifically, FIG. 6 shows (in a cross-sectional diagram) a group-IV solar cell for which the primary photoabsorber is an n-type Ge, SiGe, or SiGeSn emitter layer, that may be doped by group-V elements from III-V semiconductor layers beneath it and group-V elements from III-V semiconductors above it, and which forms the p-n junction of the solar cell at a heterostructure between the n-type Ge, SiGe, or SiGeSn emitter and p-type group-IV base or BSF layer with different composition than the n-type emitter.

According to the present disclosure, a group-IV solar cell structure, where the p-type group-IV base or BSF layer with different semiconductor composition than the group-IV emitter results in: reduced minority-carrier recombination at an interface; higher cell voltage; greater transparency to wavelengths that are not desirable to be absorbed; reduced undesirable cross-column doping among nearby semiconductor layers by eliminating unwanted dopant species in III-V or group-IV layers; enhanced desirable cross-column doping among nearby semiconductor layers by including desired dopant species in III-V or group-IV layers; and/or improved dopant confinement, e.g., as a dopant diffusion barrier, or as a trap for dopant species.

According to one variant, an epitaxially-grown SiGe or SiGeSn heterostructure back-surface field (BSF) layer disposed on a Ge or SiGe solar cell formed by epitaxial growth or from a Ge or SiGe substrate wafer.

Further, an epitaxially-grown SiGe or SiGeSn heterostructure layer used in a tunnel junction for electrical connection to a solar cell, where the heterostructure layer has higher band gap than one or more layers in the solar cell to which it connects, or than other layer(s) in the tunnel junction structure. According to another contemplated alternative, a window, emitter, BSF, or tunnel junction heterostructure layer formed from a III-V semiconductor where one or more adjacent solar cell or tunnel junction layers is prefercomposed of a group-IV semiconductor such as Ge, Si, SiGe, or SiGeSn.

In addition, the present disclosure contemplates an epitaxially-grown SiGe or SiGeSn heterostructure window or emitter layer disposed on a Ge or SiGe solar cell formed by epitaxial growth or formed from a Ge or SiGe substrate wafer, and an epitaxially-grown heterostructure layer with higher band gap and different lattice constant than one or more adjacent layers, with thickness and composition such that the heterostructure layer remains pseudomorphic with respect to adjacent layer(s), i.e., such that the heterostructure layer is strained and not relaxed, with an intact, largely defect-free crystal structure. The significance of variations using one or more strained layers in the present invention, compared to the variations of the present invention using unstrained layers alone, are several fold. The use of strained layers allows the use of different semiconductor compositions than would be available with only unstrained layers, increasing the range of bandgaps, light absorption characteristics, electronic properties such as minority-carrier lifetime and mobility, and densities of states in the valence and conduction bands, and other parameters available for the multijunction cell layers, which can be used to increase multijunction solar cell performance and that of their subcells, including energy conversion efficiency and ease of manufacture, as well as the performance of other semiconductor devices. The strain in semiconductor layers itself also changes the energy band structure of semiconductors and other electronic properties such as lifetime, mobility, and densities of states, and increases the range of energy band offsets and types of band lineups (type I heterojunctions with nested band lineup, type II heterojunctions with staggered band lineup, etc.) in the conduction and valence bands, which are also available with unstrained heterojunction layers by changing composition but with a smaller range of options in the unstrained layer case, all of which may be used to increase the performance of subcells and multijunction solar cells, as well as of other semiconductor devices. The strain in semiconductor layers may also inhibit or enhance the incorporation of dopant atoms in the layer, may can also inhibit or enhance the diffusion of dopant atoms in the layer, may inhibit or enhance the tendency of some dopants to remain on the growth surface during epitaxial growth rather than being incorporated into the semiconductor layer, and may inhibit or enhance the generation, annihilation, and transport of point defects in the crystal lattice, which also influence the movement of dopant atoms as well as the final crystal quality and dislocation density of the semiconductor crystal, all of which may be used to increase the performance of subcells and multijunction solar cells, as well as of other semiconductor devices.

A still further preferred arrangement contemplated by the present disclosure is shown in FIG. 7 with an n-type Ge, SiGe, or SiGeSn emitter solar cell described above, where the p-n junction at the back of the emitter layer is a homojunction between the n-type group-IV emitter (Ge, SiGe, or SiGeSn) and a p-type group-IV base layer, with the same composition as the emitter layer. The p-type group-IV base layer may be doped during epitaxial growth, or in may be p-type doped by the diffusion of group-III elements from the III-V layers beneath the cell. Group-III diffusions into Ge tend to have narrower profiles and higher doping concentration than group-V diffusions, aiding the formation of a p-type homojunction layer.

Further, the n-type Ge, SiGe, SiGeSn solar cell described above, where the p-type III-V semiconductor BSF or tunnel junction layer composition at the back of the cell, upon which the group-IV solar cell is grown, is chosen to optimize a p-type layer that forms at the back of the group-IV layer and creates a p-n junction in the group-IV solar cell, for instance by choosing the p-type III-V layer to contain B, Al, Ga, In, or other group-III element, or to specifically exclude these elements, in order to achieve the desired properties of the p-type diffused region at the back of the group-IV cell, e.g., high doping or a narrow doping profile.

According to another preferred variant, the present disclosure contemplates an n-type Ge, SiGe, SiGeSn solar cell described above, where the p-n junction at the back of the emitter layer is a homojunction between an n-type III-V semiconductor layer and a p-type III-V semiconductor layer at the back of the group-IV solar cell. In a preferred embodiment, the majority of the photo generation in the subcell occurs in an n-type group-IV layer of the group-IV solar cell, an n-type III-V semiconductor layer contacts the back (the side away from the primary light source) of the first n-type group-IV layer, and a p-type III-V semiconductor layer contacts the back of the aforementioned n-type III-V semiconductor layer, forming the p-n junction of the group-IV solar cell (a solar cell with a group-IV absorber) between the n-type and the p-type III-V semiconductor layers.

In yet another preferred arrangement, as shown in FIG. 8, the present disclosure further contemplates a solar cell structure where the tunnel junction between an upper group-IV subcell (C4), such as, for example, an epitaxial Ge subcell, and a lower group-IV subcell formed from the growth substrate (C5), such as a Ge substrate, is composed of group-IV materials, such as a p+Ge/n+Ge tunnel junction, a p+SiGe/n+Ge tunnel, a p+Ge/n+SiGe tunnel, p+SiGeSn/n+Ge tunnel, or a p+Ge/n+SiGeSn tunnel. In this arrangement, the primary photoabsorber is an n-type Ge, SiGe, or SiGeSn emitter layer, which may be doped by group-V elements from III-V semiconductor layers beneath it and group-V elements from III-V semiconductors above it, and for which an upper epitaxial group-IV cell is interconnected in series to a lower substrate group-IV solar cell with a group-IV tunnel junction.

FIG. 9 shows yet another preferred arrangement contemplated by the present disclosure with a group-IV solar cell structure in which the p-type side of the tunnel junction is a group-IV semiconductor such as, for example, Ge, SiGe, CGe, SiGeSn, or CSiGeSn with a different semiconductor composition than the emitter, base, BSF, or n-type side of the tunnel junction, forming a heterostructure solar cell. The n-type side of the tunnel junction may comprise a group-IV semiconductor or a III-V semiconductor material. Examples include a strained pseudomorphic SiGe, strained pseudomorphic CGe, or lattice-matched SiGeSn p-type tunnel junction layer, with higher bandgap than a Ge primary absorber layer.

According to still another alternative, the present disclosure contemplates, a group-IV solar cell structure, where the p-type group-IV tunnel junction layer with different semiconductor composition than the group-IV emitter results in reduced minority-carrier recombination at an interface, higher cell voltage, greater transparency to wavelengths that are not desirable to be absorbed, and/or improved dopant confinement, e.g., as a dopant diffusion barrier, or as a trap for dopant species.

FIG. 10 shows yet another preferred arrangement contemplated by the present disclosure with a group-IV solar cell structure in which the n-type side of the tunnel junction is a group-IV semiconductor such as, for example, Ge, SiGe, CGe, SiGeSn, or CSiGeSn with a different semiconductor composition than the emitter, base, BSF, or p-type side of the tunnel junction, forming a heterostructure solar cell. The p-type side of the tunnel junction may comprise a group-IV semiconductor or a III-V semiconductor material. Examples include a strained pseudomorphic SiGe, strained pseudomorphic CGe, or lattice-matched SiGeSn n-type tunnel junction layer, with higher bandgap than a Ge primary absorber layer.

FIG. 11 shows yet another preferred arrangement contemplated by the present disclosure with a group-IV solar cell structure in which the window layer is a group-IV semiconductor such as Ge, SiGe, CGe, SiGeSn, or CSiGeSn with a different semiconductor composition than the emitter, forming a heterostructure solar cell. The window layer may also be positioned on the base, in which case the window also forms the emitter of the cell, forming a heteroemitter solar cell. Examples include a strained pseudomorphic SiGe, strained pseudomorphic CGe, or lattice-matched SiGeSn n-type tunnel junction layer, with higher bandgap than a Ge primary absorber layer. The group-IV window layer may also be positioned on the emitter of the lower group-IV solar cell, or directly on the base of the upper and/or lower group-IV solar cells.

According to the present disclosure, advantages of the example heterostructures in FIGS. 1, 4-6, and 8-11 include: reduced minority-carrier recombination at interfaces; increased cell voltage; the ability to control light reflectance at interfaces; increased transmittance and lower wasted light absorption in inactive tunnel junction layers, and inactive window and BSF layers, and/or improved dopant confinement, e.g., as a dopant diffusion barrier, or as a trap for dopant species, to keep doping concentrations high in window and BSF layers, to keep doping profiles high and abrupt in tunnel junctions, and to reduce unwanted dopants elsewhere. The GaInP nucleation layer growth on a Ge subcell layer, such as an epitaxial Ge layer, also forms a heterostructure window layer itself on the Ge subcell. The absence of As in a GaInP, AlInP, or AlGaInP window and nucleation layer, and the lower diffusion coefficient for P compared to As, limit the extent to which n-type dopant diffuses into the Ge, SiGe, SiGeSn, or other group-IV solar cell layer beneath.

In a still further variation, the present disclosure contemplates a group-IV solar cell with a strained SiGe heteroemitter/window layer on top of it which, in addition to its minority-carrier recombination suppression and high light transmittance functions, also suppresses diffusion of group-V dopants from the III-V growth on top into the group-IV solar cell, allowing the group-IV solar cell to be optically thin and still have the p-n junction toward the front of the cell.

In another alternative, a group-IV solar cell is disclosed having a low temperature III-V layer deposited on top, from which a reduced amount of group-V elements diffuse into the group-IV solar cell due to the lower temperature, and such that the low temperature III-V layer acts as a dopant diffusion barrier for group-V elements from the growth of III-V layers at higher temperature later in the growth sequence. Here, a low temperature layer is a layer grown or deposited at a temperature that is 20 degrees Celsius or more lower than the layers grown or deposited later in the growth or deposition sequence.

Further, a group-IV solar cell is disclosed with an Al-containing III-V layer deposited on top which acts as a dopant diffusion barrier for group-V elements from the growth of III-V layers later in the growth sequence. In this case, the Al-containing layer has a lower diffusion coefficient, for the group-V elements for which the Al-containing layer acts as a diffusion barrier, than a material composed of the same material but without any aluminum (Al) present in the composition.

FIG. 12 shows yet another preferred arrangement contemplated by the present disclosure with a solar cell structure in which the upper group-IV subcell has a higher bandgap than the lower group-IV subcell, allowing the upper cell to be optically thicker than if both subcells had the same bandgap, while still transmitting significant light to the subcell beneath. This in turn allows the p-n junction to be a smaller fraction of the total layer thickness from the front of the cell, given that the group-V n-type dopants diffuse approximately the same depth into the group-IV photoabsorption layer. Examples include using SiGe, CGe, SiGeSn, or CSiGeSn for the main absorber layer of the upper subcell, and Ge for the lower subcell.

The present disclosure contemplates another set of examples includes using Ge, SiGe, SiGeSn, or CSiGeSn, for the upper subcell, and a semiconductor with smaller bandgap in the lower subcell (smaller than the bandgap of Ge in the case of a Ge upper subcell). SiGe will be in tensile strain if used in combination with other subcells at the Ge lattice constant, which can cause SiGe to relax its crystal lattice and form dislocations if the Si composition is high or the SiGe layer is thick. However, the Si composition can be kept low, the SiGe layers can be used in strain-balanced configurations, or the SiGe layers can be combined with solar cells at a lower lattice constant than that of Ge to keep the SiGe layers from relaxing. SiGeSn and CSiGeSn can be grown lattice-matched to Ge.

According to the disclosure, a feature of an optically thicker upper group-IV subcell, of ~1-5 microns in thickness, is that the n-type diffusion of group-V elements from III-V semiconductor growth on top of the group-IV subcell will typically be only 0.4-0.6 microns in depth, allowing part of the group-IV subcell to be an undiffused p-type base in the finished device, as in more conventional solar cell structures, and as also shown in FIG. 12.

FIG. 13 plots experimental, measured light I-V curves of a 2-junction (2J) Ge/Ge subcell, or 2× Ge subcell, with an interconnecting AlGaAs/GaAs tunnel junction and with both subcells active, and having a structure similar to that shown in FIG. 4 with an epitaxially-grown Ge absorber layer in the upper group-IV subcell, that is largely or entirely n-type due to group-V element diffusion from III-V semiconductor layers on both top and bottom. The upper 3 subcells in FIG. 4 were replaced in this experimental sample with growth of inactive, isotype solar cell layers in order to focus on the performance of the 2J Ge/Ge cell. The inactive, isotype layers used give the full thermal budget and full light filtering properties that would come with active upper subcells. The light I-V measurements were made on modified terrestrial quick process (MTQP) solar cells, under a pulsed solar simulator at a light intensity greater than 2000 suns (200.0 W/cm$^2$). The dual junction epitaxial Ge/substrate Ge cell pair developed a high open-circuit voltage Voc of 0.87 V at this concentration. The light I-V characteristic for a single junction Ge subcell formed in the Ge substrate, with the same inactive, isotype upper cell layers that were used in the 2J Ge/Ge cell case, is also plotted in FIG. 13 for comparison. Under the same test conditions, this single junction Ge cell has a Voc of 0.44 V. Thus, the 2-junction Ge/Ge cell structure, with a heterojunction, epitaxially-grown Ge subcell, interconnected by a tunnel junction to another active Ge subcell formed in the Ge growth substrate, delivers approximately twice the voltage of a 1-junction Ge cell. The functioning epitaxial Ge solar cell in a dual junction Ge/Ge cell configuration, in combination with functioning tunnel junctions at high current densities, enables high-efficiency cells with 4, 5, 6, or more junctions with an epitaxial Ge subcell.

According to the present disclosure, preferred group-IV solar cells employ a heterostructure layer such as those described earlier in the text, where the solar cell is a subcell that is part of a multijunction solar cell. The group-IV solar cell structures discussed here are extremely useful when integrated into multijunction cells, such as, for example:

4J AlGaInP/AlGaInAs/Ge/Ge solar cells;
5J AlGaInP/AlGaInAs/GaInAs/Ge/Ge solar cells; and
6J AlGaInP/GaInP/AlGaInAs/GaInAs/Ge/Ge solar cells.

In all of these multijunction cells using high-bandgap AlGaInP top subcells, the emitter may have a lower Al composition (low-Al AlGaInP), or an Al-free composition (GaInP), to improve minority-carrier lifetime, mobility, diffusion length, and blue response and current density of the top subcell. Though this often results in a lower voltage of the AlGaInP-base top cell, it is often a worthwhile tradeoff because of the increased short-wavelength quantum efficiency and current produced using a low-Al or Al-free emitter.

In a conventional 3J GaInP/GaInAs/Ge solar cell there is substantial wasted photogenerated current density in the Ge bottom cell, which can be used much more effectively with the higher voltage of a 2-junction Ge/Ge cell combination at the bottom of a 4J AlGaInP/AlGaInAs/Ge/Ge solar cell. A 4-junction AlGaInP/AlGaInAs/GaInAs/Ge solar cell has the advantage of having higher voltage and lower current compared to a 3J cell, resulting in lower series resistance $I^2R$ power losses for current I and electrical resistance R, but the Ge bottom cell has an even greater wasted surplus of photogenerated current. As a result, the 4J AlGaInP/AlGaInAs/GaInAs/Ge cell benefits even more from the incorporation of a 2-junction Ge/Ge, or 2× Ge, cell combination as the bottom two subcells in a 5J AlGaInP/AlGaInAs/GaInAs/Ge/Ge solar cell. FIG. 14 shows the cross sectional diagram, calculated subcell and multijunction cell light I-V curves, and calculated light I-V parameters for this type of 5J cell. The light I-V parameters are calculations indicative of expected average production performance of the 5J cell, with an projected average efficiency over 42% under the AM1.5D spectrum at 500 suns (50 W/cm$^2$), significantly higher than the 40% efficiency of the best conventional 3-junction cells presently available in production. There is still some excess photogenerated current in high-performance 2J Ge/Ge subcells in the 5J cell, which can be put to better use as discussed below.

FIG. 14 is a cross sectional diagram showing calculated subcell and multijunction cell light I-V curves, and calculated light I-V parameters for a 5-junction (5J) AlGaInP/AlGaInAs/GaInAs/Ge/Ge solar cell, using an epitaxial Ge cell 4, and a 2-junction Ge/Ge combination for the bottom two cells in the stack. The excess photogenerated current density can be seen in the light I-V curves of Ge subcells 4 and 5 for the 5J cell in FIG. 14. If the bandgap of subcell 3 can be lowered to convert some of this photogenerated current at the higher voltage of the GaInAs subcell, and the bandgaps of subcells 1 and 2 can be tuned to maintain current balance with this change in subcell, then less current is wasted in subcells 4 and 5 and the 5J cell efficiency increases. One way to achieve a lowering of the effective bandgap of subcell 3 is to incorporate energy wells, or low-bandgap absorber regions (LBARs), into the intrinsic region of the cell base. Such energy wells may be thin enough that the energy levels of carriers confined in the wells are shifted due to quantum mechanical effects, or may be thick enough that such quantum mechanical energy shifts are negligible. Such energy wells are typically, but not always, strain-balanced with tensile strain-compensation layers to counteract the compressive stress of, for instance, 12%—In GaInAs energy wells in a 1%—In GaInAs cell 3 intrinsic region. The energy wells in cell 3 may be used in combination with a Bragg reflector at the back of cell 3, to reflect back light that was not absorbed the energy wells on the first pass, for a second chance or more at being absorbed. The Bragg reflector can also reflect back the light generated by radiative recombination in the energy wells, which can be quite strong in a high-efficiency cell, giving that light multiple chances to be absorbed again by the energy wells, increasing the subcell 3 current density, steady-state excess carrier concentration, and subcell voltage.

By lowering the effective bandgap of subcell 3, more current is collected at the subcell 3 voltage, rather than the relatively low voltage of the Ge cells, increasing the efficiency of the 5-junction cell. FIG. 15 is a cross-sectional diagram showing calculated subcell and multijunction cell light I-V curves, and calculated light I-V parameters for a 5J cell with an epitaxial Ge cell 4 in a 2J Ge/Ge cell configuration at the bottom of the stack, and with energy wells, to lower the effective bandgap of subcell 3, resulting in higher 5J cell efficiency. The light I-V parameters are calculations indicative of expected average production performance of this type of 5J cell, with an increased projected average efficiency over 43% under the AM1.5D spectrum at 500 suns (50 W/cm$^2$), relative to the upright, lattice-matched 5J cell with no energy wells in cell 3, as depicted in FIG. 14.

Similarly, the entire composition of GaInAs subcell 3 can be shifted to lower bandgap in a metamorphic (MM) solar cell, to make better use of the excess photogenerated current in the 2J Ge/Ge bottom cell configuration of a lattice-matched 5J cell. The lattice constant of subcell 3 is shifted to a large atomic spacing, by virtue of a metamorphic buffer that transitions from the Ge substrate lattice constant to that of the upper subcells. The bandgaps of subcells 1 and 2 are also shifted to lower values at this larger lattice constant, but this may be compensated for in the top cell by adding more Al.

As before, by lowering the effective bandgap of subcell 3 with this metamorphic approach, more current is collected at the subcell 3 voltage, rather than the relatively low voltage of the Ge cells, increasing the efficiency of the 5-junction cell. FIG. 16 is a cross-sectional diagram showing calculated subcell and multijunction cell light I-V curves, and calculated light I-V parameters for a 5J cell with an epitaxial Ge cell 4 in a 2J Ge/Ge cell configuration at the bottom of the stack, and with metamorphic subcells 1, 2, and 3 (grown with a relatively modest amount of lattice mismatch with respect to the growth substrate) to lower the bandgap of subcell 3, resulting in higher 5J cell efficiency. A relatively small amount of lattice mismatch is desirable, to keep growth costs low for the metamorphic buffer, to reduce wafer bow from strain induced by the lattice mismatch, and thereby reduce yield losses that can stem from wafer bow, and perhaps most importantly, to minimize dislocations resulting from the lattice mismatch, which can cause higher minority-carrier recombination and shunt paths for solar cells. The light I-V parameters are calculations indicative of expected average production performance of this type of 5J cell, with an increased projected average efficiency over 43% under the AM1.5D spectrum at 500 suns (50 W/cm$^2$), relative to the upright, lattice-matched 5J cell in FIG. 14.

FIG. 17 shows the plotted results for yet another preferred arrangement contemplated by the present disclosure with the calculated external quantum efficiency (EQE), internal quantum efficiency (IQE), and overall absorptance for a 5-junction cell incorporating an epitaxial, heterojunction Ge cell 4 showing the light response of each subcell. The 5-junction cell has an AlGaInP/AlGaInAs/GaInAs/epitaxial Ge/substrate Ge cell structure, with a base bandgap combination of 2.05/1.68/1.41/0.67/0.67 eV. The top cell (cell 1 or C1) has an AlGaInP emitter bandgap of 1.95 eV in combination with the 2.05 eV base. The transparency of the thin epitaxial Ge cell 4 (C4), and its transmission of some light through to the thick substrate Ge cell 5 (C5) can be seen in the overlapping quantum efficiency curves in FIG. 17.

FIG. 18 shows yet another preferred arrangement contemplated by the present disclosure with the measured light I-V characteristics of two fully-integrated prototype 5-junction (5J) cells, incorporating a heterojunction epitaxial Ge cell 4. The 5J cells have an AlGaInP/AlGaInAs/GaInAs/epitaxial Ge/substrate Ge cell structure, with all subcells active, with a 2.05/1.64/1.40/0.67/0.67 eV base bandgap combination, as shown in the schematic diagram in FIG. 18. Both of the 5-junction cells in FIG. 18 interconnect the epitaxial heterojunction Ge cell 4 with a substrate Ge cell 5 using a III-V tunnel junction: a GaAs/GaAs tunnel junction as in FIG. 1 for the curve indicated by triangles in FIG. 18, and an AlGaAs/GaAs tunnel junction as in FIG. 4, for the curve indicated by squares in FIG. 18. The light I-V measurements were made on modified terrestrial quick process (MTQP) solar cells, under an Ioffe solar simulator at a nominal concentration at greater than 2000 suns (200.0 W/cm$^2$). The 5-junction cells exhibit open-circuit voltage Voc of approximately 5.2 V under these test conditions. FIG. 18 also shows the light I-V characteristic of a 4-junction cell for comparison, which has the same structure as the 5J cells except that the epitaxial Ge cell 4 and associated tunnel junction are absent. These control 4J cells have the same short-circuit current density Jsc as the 5J cells, but their Voc is lower at approximately 4.8 V. Thus the heterojunction epitaxial Ge cell 4 contributes ~0.4 V to the 5J cell structure, as expected, enabling high-efficiency 5-junction solar cells.

Therefore, according to the present disclosure, a preferred solar cell comprises additional heterostructure layer(s) having higher bandgap(s) than the first photoabsorbing layer, in order: 1) to reduce unwanted photoabsorption in the additional heterostructure layers(s); 2) to suppress minority-carrier recombination within and at one or more surfaces of the additional heterostructure layer; and/or 3) to reduce unwanted dopant or other impurity diffusion from one part of the solar cell to another, particularly since many of these heterostructures may include both group-IV and III-V semiconductors in adjacent layers, and the elements in these different families of semiconductors act as dopants in the other family of semiconductors, a phenomenon termed here as cross-column doping, referring to the columns in the periodic table of elements.

In an alternative, the present disclosure contemplates a solar cell with at least one, first layer composed of a group-IV semiconductor, such as Ge, Si, SiGe, SiGeSn, or CSiGeSn, in which part of the solar cell such as the emitter, base, window, back surface field (BSF) layer, intrinsic layer, or tunnel junction layer comprises a second layer composed of a III-V semiconductor or group-IV semiconductor layer with different composition than the first group-IV layer, such that a heterostructure is formed between the first group-IV layer and the second III-V or group-IV layer. The group-IV layers in the solar cell may be epitaxially-grown, may be a formed from a growth substrate wafer, or may be wafer-bonded layers. The solar cell containing at least one group-IV layer may be a single-junction cell or a subcell in a multijunction solar cell, and the additional III-V semiconductor or group-IV semiconductor layers forming the heterostructure may form additional parts of the first solar cell, or may form additional subcells in a multijunction solar cell. The invention increases the voltage, current, fill factor, and/or efficiency of the multijunction or single-junction solar cell.

The heterostructure may allow the formation of the solar cell, as when the heterostructure is also a p-n junction formed between the base and emitter of the cell, allowing a multijunction or single-junction solar cell to be formed with greater voltage, current, fill factor, and/or efficiency. The heterostructure may also be an isotype heterostructure, such as between the emitter and window, between the window and n-type side of a tunnel junction, between the base and BSF, or between the BSF and p-type side of a tunnel junction, allowing a multijunction or single junction solar cell to be formed with greater voltage, current, fill factor, and/or efficiency. The heterostructure may also comprise a tunnel junction, such as when the heterostructure is a p-n junction that forms a tunnel junction, allowing a multijunction or single-junction solar cell to be formed with greater voltage, current, fill factor, and/or efficiency.

The invention may be used in a lattice-matched, upright-grown multijunction solar cell, with significant advantages in growth cost, yield, wafer bowing, and processing cost compared to highly-lattice mismatched metamorphic cells or cells with an inverted-growth structure. However, the present invention may be used to advantage in multijunction cells with layers having a relatively small amount of lattice mismatch, in either metamorphic layers or pseudomorphically-strained layers such as low-bandgap absorber layers, or in pseudomorphically-strained window, emitter, base, BSF, intrinsic layers or tunnel junction layers. Also, the present invention may also be used to advantage in inverted-growth structures that are lattice-matched or have a relatively small amount of lattice mismatch.

According to the present disclosure, preferred variations include a group-IV solar cell that is optically thin in order to leak a substantial amount of light to an additional subcell beneath, e.g., an epitaxially-grown Ge, SiGe, or SiGeSn subcell on top of a Ge substrate subcell in a multijunction solar cell, in which most or all of the photoabsorbing group-IV layer in the group-IV solar cell is doped n-type by the growth of subcells on top, and/or by III-V semiconductor layers on which the group-IV solar cell is grown, such that the p-n junction is formed at the back of the main photoabsorbing group-IV layer.

Further alternatives include a group-IV solar cell in which the main photoabsorbing layer is an epitaxially-grown Ge, SiGe, or SiGeSn n-type emitter layer, doped n-type by the nucleation and growth of III-V semiconductors on top of it, from which photogenerated minority holes are collected at a p-n junction at the back of this n-type Ge, SiGe, or SiGeSn emitter layer.

According to further variations, the present disclosure contemplates an n-type Ge, SiGe, SiGeSn emitter solar cell, such as those described herein, with thicknesses in the range of from about 0.01 to about 10 microns, and preferably in the range of from about 0.1 to about 2 microns, and still more preferably in the range of from about 0.3 to about 1 micron.

As shown in FIG. 1, examples of the n-type Ge, SiGe, SiGeSn emitter solar cell described above are further contemplated by the disclosure, where 1) the p-n junction at the back of the emitter layer is formed by a p-type layer, which stops the n-type doping that diffuses in from the front of the cell, since the group-V elements that cause n-type doping in group-IV semiconductors are not dopants in semiconductors; 2) where the p-n junction at the back of the emitter layer is a heterojunction between the n-type group-IV emitter and a p-type III-V semiconductor base or BSF layer; and 3) where the p-n junction at the back of the emitter layer is a heterojunction between the n-type group-IV emitter and a p-type GaAs base or BSF layer.

Further contemplated variations of the present disclosure include an upper group-IV solar cell that is optically thin, that transmits roughly half of the light energy incident upon it to a second, lower group-IV solar cell positioned beneath the first, upper group-IV cell, such that it is in optical series with the first cell. The upper group-IV cell and the lower group-IV cell may be connected in electrical series by a tunnel junction, which it is desirable to make as transparent as possible to the wavelengths used by the second, lower cell. Calculated quantum efficiencies of a thin, upper, epitaxial Ge subcell 4 in a 5J cell, and of an optically thick, lower Ge substrate subcell 5 in a 5J cell, are plotted as a function of wavelength for various upper subcell thicknesses in FIG. 2, using Ge absorption coefficients. The resulting current balance for various upper subcell thicknesses can be seen in FIG. 2. The current densities of both the upper and lower group-IV subcells, and the ratio of their currents, called the J-ratio, is plotted as a function of thickness in FIG. 3.

Presently contemplated solar cell further include those where the additional heterostructure layer(s) have higher bandgap(s) than the first photoabsorbing layer, in order:

1) to reduce unwanted photoabsorption in the additional heterostructure layers(s);

2) to suppress minority-carrier recombination within and at one or more surfaces of the additional heterostructure layer; and/or 3) to reduce unwanted dopant or other impurity diffusion from one part of the solar cell to another, particularly since many of these heterostructures may include both group-IV and III-V semiconductors in adjacent layers, and the elements in these different families of semiconductors act as dopants in the other family of semiconductors, a phenomenon termed here as cross-column doping, referring to the columns in the periodic table of elements.

Any of the group-IV subcell combinations discussed earlier, such as a SiGeSn cell 4/Ge cell 5 combination, may be used in place of the 2-junction Ge/Ge bottom cells in 4-junction and 5-junction cells. In addition, any of the group-IV subcell heterostructures may be used in the bottom group-IV cells of 3-junction, 4-junction and 5-junction cells. Similar arguments apply to cells with 6-junctions or more.

The group-IV solar cell layers and solar structures contemplated here in which the group-IV semiconductors are employed are designed to make use certain natural electronic band structure features and semiconductor parameters of group-IV materials. The optically-thin upper Ge, SiGe, or SiGeSn subcells can have a small physical thickness due to the high absorption coefficient of these materials relative to many indirect gap semiconductors, because of a direct gap transition that exists close to and above the indirect gap in energy for many compositions of these group-IV semiconductors. For example, Ge absorbs strongly for photon energies above the ~0.8-eV direct gap in this material, allowing relatively small thicknesses on the order of 0.5 microns to be sufficient for a Ge upper subcell for current matching, with the attendant low growth times and low cost of epitaxial growth, even though Ge is an indirect semiconductor with an indirect gap slightly lower at 0.67 eV. When charge carriers thermalize to the lower indirect gap, the requirement for an electron-hole recombination event to involve 3 bodies in order to take place—the electron, the hole, and also a phonon—resulting in a very long minority carrier lifetime compared to direct gap semiconductors. Coupled with the very high carrier mobilities in Ge, these long lifetimes result in very long minority-carrier diffusion lengths, making these group-IV solar cells highly tolerant to defects, impurities, and other imperfections that tend to increase undesirable Shockley-Read-Hall (SRH) recombination. Thus a thin solar cell with low-cost growth, combining high absorption coefficient, and high tolerance to defects and non-ideal recombination mechanisms can be achieved with Ge, SiGe, SiGeSn, and other group-IV solar cells, and it is contemplated that the best solar cells will adjust the compositions of the group-IV solar cells to maximize these effects for a given solar cell application.

In addition, it is contemplated that the band structure of group-IV layers in the solar cell may be designed, controlled, and manipulated by compressive or tensile strain in the layers, and by selection of group-IV composition, to achieve desirable optical and electrical properties in the solar cell. For example, compressive or tensile strain for certain group-IV semiconductor compositions may increase their bandgap, making them more transmissive to incident light which is desirable for layers such as tunnel junction layers, window layers, and BSF layers in which minority-carrier collection probability may be impaired, and can be desirable in emitter and base layers to adjust subcell bandgap and current collection, and increase subcell voltage. Compressive and tensile strain, and group-IV composition may also be used to adjust whether the semiconductor has an indirect gap or a direct gap as the lowest energy transition, may be used to adjust the energy difference between indirect and direct bandgaps, and may be used to adjust effective densities of states in the conduction and valance bands, affecting photoabsorption in the layers, as well as the ease at which the semiconductors may be doped degenerately with the Fermi level residing in the conduction or valance band of allowed energies, impacting the ease and doping level at which tunnel junctions may be constructed in the group-IV semiconductor material.

Structures with selective wavelength reflection and anti-reflection (AR) structures may be combined with group-IV solar cells, and their reflectance properties may be tuned to increase the performance of the group-IV solar cell, and/or a multijunction solar cell in which it is used, for example: Bragg reflector structures using semiconductor materials with different refractive indices, may be incorporated behind a group-IV solar cell to increase the optical path length and current density of that cell, such as in an epitaxial cell 4 or substrate cell 5 in an upright 5-junction solar cell, epitaxial cell 4 and/or epitaxial cell 5 in an inverted 5-junction solar cell, epitaxial cell 4 and/or epitaxial cell 5 and/or substrate cell 6 in an upright 6-junction solar cell, etc.; back surface reflector structures using a metal/dielectric, metal/semiconductor, and/or semiconductor/dielectric structure, in addition to all-semiconductor structures may be incorporated with a group-IV cell to increase its current density, such as the substrate cell 5 of an upright 5-junction cell, the epitaxial cell 5 of an inverted 5-junction solar cell, or the bottom cell of an upright or inverted multijunction solar cell with 2, 3, 4, 5, 6 or more junctions. Multilayer AR coatings on the front or the back of the solar cell may be tuned with regard to their reflective properties as a function of wavelength, in order to increase the performance of a multijunction cell incorporating a group-IV solar cell.

Although most examples here have discussed an n-on-p solar cell configuration, in which light first strikes the n-type side of the solar cell p-n junction, similar principles can be adapted to apply to, and the present disclosure contemplates, p-on-n solar cell configurations as well.

In addition, although most examples here have discussed structures that make use of or can function with cross-column doping between group-IV semiconductors and III-V semiconductors, similar principles can also be adapted to, and the present disclosure contemplates, devices incorporating group-IV, III-V, II-VI, I-III-VI, III-IV-VI, and other families of semiconductors, and the cross-column doping that can take place between them.

Further, although most examples shown here discuss group-IV solar cells with group-IV semiconductor layers formed from column-IV elements alone, other chemical compounds are contemplated, such as those that include one or more group-IV elements in combination with one or more group-III elements, e.g., boron in combination with silicon, BSi; AlSi; or GaGe, or that include one or more group-IV elements in combination with one or more group-V elements, e.g., phosphorus in combination with silicon, SiP; SiN; or GeAs. Such compounds may be useful for highly doped layers such as tunnel junction layers, or may be used for other layers of the solar cell such as contact, window, emitter, base, and BSF regions.

Although most examples shown here may use III-V semiconductors for the contact layers (also known as cap layers), group-IV semiconductors such as Ge, Si, SiGe, SiGeSn, and CSiGeSn, may be used as the contact or cap layers. These layers have relatively low bandgaps compared to many III-V semiconductors, helping to lower contact resistance between the semiconductor contact layer and a metal contact, and group-IV materials can be grown lattice-matched to a variety of III-V compounds, maintaining high crystal defect density. Since in an upright growth configuration the front contact or cap layer is the last layer grown, even if the contact material, e.g., a group-IV contact material, has a high lattice mismatch to the III-V layers it is grown on (such as a lower layer of the contact or cap structure formed from III-V semiconductors), the structure can be highly tolerant of the high lattice mismatch, since no further semiconductor layers will be grown on top of the last contact layer, and hence the dislocation density in the last contact layer can be quite high without harming active layers in the device for which long minority-carrier lifetime is important. It is also considered in this disclosure that group-IV layers grown as the last layer or layers on the top of the multijunction solar cell may be used to construct bypass diodes for the purpose of protecting the multijunction solar cell or other multijunction cells in the circuit, or blocking diodes or other types or electronic and optoelectronic devices that are grown monolithically with the multijunction cell itself, for use in the solar cell circuit.

Still further, although most examples here have discussed upright, lattice-matched multijunction cells, the subcells in the multijunction cell, including the group-IV subcells described in this disclosure, may be grown inverted, such as, for example, with the sunward surface of the cell grown first, and in a multijunction cell with the higher bandgap subcells grown first, and/or may be grown as metamorphic cells, lattice-mismatched with respect to the growth substrate or to the surface on which they are grown. A potential advantage of inverted growth may be that the lower group-IV cells and associated tunnel junctions will experience less degradation from the thermal budget of the other subcells in an inverted configuration, since the lower group-IV cells will be grown after the upper subcells in an inverted configuration. A potential advantage of metamorphic or lattice-mismatched growth is the larger range of semiconductor materials, compositions, and bandgaps this approach allows. For example, metamorphic SiGe subcells may be grown on Si substrates, metamorphic SiGe subcells may be grown on Ge substrates, metamorphic CSiGeSn subcells may be grown on Si or Ge substrates, lattice-mismatched or metamorphic Ge subcells may be grown as the bottommost cell (cell 4) in a 4-junction inverted metamorphic cell design, replacing the ~0.7-eV metamorphic GaInAs cell usually used in that position, thus reducing the growth time required for the second metamorphic buffer normally required in usual 4-junction inverted metamorphic cell design, etc.

While most examples here have discussed a monolithic, epitaxially-grown multijunction cell structure that may be formed in 1, 2, 3, or more epitaxial growth runs on the same growth substrate, the present disclosure contemplates that the subcells in the multijunction cell, such as, for example, the epitaxial group-IV and/or substrate group-IV cell or cells, also may be integrated into the multijunction structure using wafer bonding, or semiconductor bonding technology (SBT), or using a combination of monolithic growth and SBT. Examples include the upper 3-junction AlGaInP/AlGaInAs/GaInAs cell combination semiconductor bonded or bonded with a metal/dielectric interface to lower group-IV cells, such as, for example, a 1-junction Ge, SiGe, or SiGeSn cell, a 2-junction Ge/Ge, SiGe/Ge, or SiGeSn/Ge cell, or 3-junction SiGeSn/SiGeSn/Ge group-IV cell, to form 4, 5, or 6-junction SBT cells that incorporate one or more group-IV subcells.

Still further, while most examples herein have discussed group-IV solar cells with heterostructures formed between solar cell layers such as between emitter and base, or between base and BSF, etc., the present disclosure contemplates that heterostructures may also be formed within these solar cell layers, with lower bandgap, higher bandgap, or the same bandgap as the surrounding material in the solar cell layer. For example, energy wells may be placed in the main absorber layer of a group-IV solar cell that may be an emitter, base, or other layer of a solar cell, to lower the effective bandgap of the group-IV absorber layer, such as, for example, strained or unstrained Ge, SiGe, or SiGeSn energy wells and/or strain-balance layers in a group-IV absorber layer grown on a silicon substrate, such as, for example, metamorphic SiGe or pseudomorphic SiGeSn absorber layers, GeSn or SiGeSn energy wells in a Ge absorber to lower the effective bandgap of cell 5 in a 5-junction cell below that of Ge, GeSn energy wells in combination with SiGe strain-balance layers, and/or unstrained Ge energy wells in SiGeSn solar cell absorber layers.

While most examples here have discussed forming the group-IV solar cell layers using epitaxial growth, such as, for example: chemical vapor deposition (CVD), ultra-high-vacuum chemical vapor deposition (UHVCVD), metal-organic vapor-phase epitaxy (MOVPE), molecular beam epitaxy (MBE), liquid phase epitaxy (LPE), and others; or by dopant diffusion into a group-IV substrate, the present disclosure also contemplates that the group-IV solar cell layers may also be formed by other methods. These include, for example, physical vapor deposition (PVD) with or without subsequent annealing and/or recrystallization, and ion implantation of dopants and/or main components of the group-IV semiconductor into a starting group-IV substrate, such as, for example: implantation of Si into a Ge substrate to form a SiGe solar cell layer; Si and Sn into a Ge substrate to form a SiGeSn cell layer; carbon (C) into a Ge substrate to form a CGe layer; Ge into a silicon (Si) substrate to form a SiGe solar cell layer; Ge and Sn into a Si substrate to form a SiGeSn cell layer; n-type dopants into a p-type group-IV substrate, or other epitaxially-grown, diffused, or ion-implanted layer, to form an n-type layer, and/or p-type dopants into an n-type group-IV substrate, or other epitaxially-grown, diffused, or ion-implanted layer, to form a p-type layer.

In addition, although most examples here have discussed the formation of group-IV solar cells with the goal of incorporating them into a multijunction solar cell in combination with another group-IV solar cell to form a 2-junction group-IV solar cell pair within a larger multijunction stack which includes additional III-V subcells, the present disclosure also contemplates applying the principles disclosed herein to: single-junction group-IV solar cells; to group-IV solar cell combinations incorporating 3 or more group-IV solar cells in a multijunction solar cell stack; and/or to multijunction cells that include subcells formed from group-IV, III-V, II-VI, III-IV-VI, and additional families of semiconductors.

Although most examples here have discussed solar cells, the disclosure further contemplates usefulness with other types of optoelectronic devices employing photovoltaic cells and systems. Indeed, any required need for sustainable energy storage and deployment would find use and benefit from the present disclosure. For example, due to the increased efficiency of the photovoltaic cell systems of the present disclosure, manned or unmanned vehicular operation in a terrestrial and/or non-terrestrial setting are made possible. Contemplated vehicles include manned and unmanned aircraft, spacecraft, terrestrial, non-terrestrial and surface and sub-surface water-borne vehicles.

While the preferred variations and alternatives of the present disclosure have been illustrated and described, it will be appreciated that various changes and substitutions can be made therein without departing from the spirit and scope of the disclosure. Accordingly, the scope of the disclosure should only be limited by the accompanying claims and equivalents thereof.

We claim:

1. A photovoltaic cell comprising:
at least two group-IV subcells within a multijunction cell, wherein at least one upper subcell is positioned closer to a primary light source than at least one lower subcell, wherein the at least one upper subcell has a higher direct or indirect energy bandgap than the lower subcell, and wherein at least one of the group-IV subcells further comprises a first layer comprising a solar cell emitter layer formed from a group-IV layer, and a second layer comprising tunnel junctions formed from one or more group III-V semiconductor layers, the group-IV layer forming a heterojunction with the one or more group III-V semiconductor layers.

2. The photovoltaic cell of claim 1, wherein the compositions for the upper and lower subcells are selected from the group consisting of: Ge, Si, SiGe, CGe, GeSn, SiGeSn, and CSiGeSn.

3. The photovoltaic cell of claim 1, wherein at least one upper subcell comprises SiGeSn, and at least one lower subcell comprises Ge.

4. The photovoltaic cell of claim 1, wherein the one or more group III-V semiconductor layers are selected from the group consisting of: GaAs, AlGaAs, GaInAs, AlGaInAs, InP, GaP, GaInP, GaInPAs, AlInP, AlGaInP, InAs, InPAs, AlInAs, AlAs, GaSb, GaAsSb, InSb, GaInAsSb, GaInNAs, GaInNAsSb, GaN, AlN, InN, GaInN, AlGaN, AlInN, AlGaInN, and combinations thereof.

5. The photovoltaic cell of claim 1, wherein the tunnel junctions are selected from the group consisting of:
p+GaAs/n+GaAs tunnel junctions;
p+AlGaAs/n+GaAs tunnel junctions;
p+GaAs/n+AlGaAs tunnel junctions;
p+AlGaAs/n+AlGaAs tunnel junctions;
p+AlGaAs/n+GaInP tunnel junctions;
p+AlGaAs/n+AlGaInP tunnel junctions; and
p+AlGaInP/n+AlGaInP tunnel junctions.

6. The photovoltaic cell of claim 1, wherein the two or more group-IV subcells are subcells within a multijunction photovoltaic cell.

7. The photovoltaic cell of claim 6, wherein the group-IV layer is epitaxially grown on the group III-V semiconductor layers.

8. The photovoltaic cell of claim 1, wherein the group-IV layer is n-type and at least one of the group III-V semiconductor layers is p-type.

9. The photovoltaic cell of claim 7, wherein the group-IV layer is n-type and at least one of the group III-V semiconductor layers is p-type.

10. The photovoltaic cell of claim 1, wherein the at least one of the group-IV subcells further comprises a base layer.

11. The photovoltaic cell of claim 1, wherein the at least one of the group-IV subcells further comprises a base layer, wherein the emitter layer comprises a lower energy bandgap than the base layer of the subcell.

12. The photovoltaic cell of claim 1, wherein the at least one of the group-IV subcells further comprises a base layer, wherein the emitter layer comprises a higher energy bandgap than the base layer of the solar cell.

13. The photovoltaic cell of claim 1, wherein the at least one of the group-IV subcells further comprises a base layer, wherein the emitter layer has approximately the same energy bandgap as the base layer of the solar cell.

14. A vehicle comprising the photovoltaic cell of claim 1.

15. An energy storage system comprising the photovoltaic cell of claim 1.

16. An energy generation system comprising the photovoltaic cell of claim 1.

17. A method for energy generation comprising the step of:
providing a photovoltaic cell comprising at least two group-IV subcells within a multijunction cell, wherein at least one upper subcell is positioned closer to a primary light source than at least one lower subcell, wherein the at least one upper subcell has a higher direct or indirect energy bandgap that the lower subcell, wherein at least one of the group-IV subcells further comprises a first layer comprising a solar cell emitter layer formed from a group-IV layer, and a second layer comprising tunnel junctions formed from one or more group III-V semiconductor layers, the group-IV layer forming a heterojunction with the one or more group III-V semiconductor layers, and wherein the group-IV layer is epitaxially grown on the one or more group III-V semiconductor layers.

18. The method of claim 17, wherein the compositions for the upper and lower subcells are selected from the group consisting of: Ge, Si, SiGe, CGe, GeSn, SiGeSn, and CSiGeSn.

19. The method of claim 17, wherein at least one upper subcell comprises SiGeSn, and at least one lower subcell comprises Ge.

* * * * *